US006847807B1

(12) United States Patent
Fujiki

(10) Patent No.: US 6,847,807 B1
(45) Date of Patent: Jan. 25, 2005

(54) TRANSMISSION CIRCUIT AND RADIO TRANSMISSION APPARATUS

(75) Inventor: Hiroyuki Fujiki, Fujisawa (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 499 days.

(21) Appl. No.: 09/604,823

(22) Filed: Jun. 28, 2000

(30) Foreign Application Priority Data

Jun. 29, 1999 (JP) ............................................ 11-183223
Dec. 28, 1999 (JP) ............................................ 11-375483

(51) Int. Cl.[7] ................................................ H04B 1/04
(52) U.S. Cl. ..................... 455/123; 455/126; 455/164.2; 455/232.1; 375/295; 375/316; 330/75
(58) Field of Search .............................. 455/123, 126, 455/161.2, 164.2, 173.1, 177.1, 181.1, 181.2, 232.1, 234.1; 375/295, 297, 316; 330/75; 370/310.2, 318

(56) References Cited

U.S. PATENT DOCUMENTS

| | | | | |
|---|---|---|---|---|
| 5,107,225 A | * | 4/1992 | Wheatley et al. ............ 330/279 |
| 5,193,223 A | * | 3/1993 | Walczak et al. ............. 455/115 |
| 5,222,104 A | * | 6/1993 | Medendorp ................. 375/308 |
| 5,283,536 A | | 2/1994 | Wheatley, III et al. |
| 5,287,555 A | * | 2/1994 | Wilson et al. ................. 56/343 |
| 5,307,512 A | * | 4/1994 | Mitzlaff ........................ 455/126 |
| 5,471,654 A | * | 11/1995 | Okazaki et al. .............. 455/126 |
| 5,548,826 A | | 8/1996 | Sayers |
| 5,862,460 A | * | 1/1999 | Rich ............................ 455/116 |
| 5,926,749 A | * | 7/1999 | Igarashi et al. .............. 455/127 |
| 5,982,824 A | | 11/1999 | Ann |
| 6,118,987 A | * | 9/2000 | Hiramatsu et al. ........... 455/108 |
| 6,127,890 A | * | 10/2000 | Shimomura et al. ......... 330/254 |
| 6,169,463 B1 | * | 1/2001 | Mohindra et al. ........... 332/104 |
| 6,242,976 B1 | * | 6/2001 | Yuen et al. .................. 330/129 |
| 6,480,477 B1 | * | 11/2002 | Treadaway et al. .......... 370/314 |
| 6,510,309 B1 | * | 1/2003 | Thompson et al. ............ 455/78 |

FOREIGN PATENT DOCUMENTS

| | | |
|---|---|---|
| EP | 0 740 422 A2 | 10/1996 |
| GB | 2317 285 A | 3/1998 |
| JP | 4-14902 | 1/1992 |
| JP | 9-270649 | 10/1997 |
| JP | 11-8564 | 1/1999 |

OTHER PUBLICATIONS

Negus, K. J. et al., "RFICs for Reduced Size, Cost and Power Consumption in Handheld Wireless Transceivers," Universal Personal communications, 1993, Personal Communications: Gateway to the International conference on Ottawa, Ont., Canada, 12–15. 1993, New York, NY USA, IEEE, Oct. 12, 1993, pp. 919–925.

* cited by examiner

Primary Examiner—William Trost
Assistant Examiner—Stephen D'Agosta
(74) Attorney, Agent, or Firm—Oblon, Spivak, McClelland, Maier & Neustadt, P.C.

(57) ABSTRACT

A modulator receives an I-phase transmission data signal and a Q-phase transmission data signal, which have been spread-spectrum processed, and modulates an intermediate frequency signal in accordance with the data signals, an IF-AGC amplifier amplifies the output of the modulator, the gain of the IF-AGC amplifier being controlled in accordance with a gain control signal, an up-converter increases the output of the IF-AGC amplifier to a propagation frequency, the gain of the up-converter being controlled in accordance with a control signal.

20 Claims, 8 Drawing Sheets

US 6,847,807 B1

TRANSMISSION CIRCUIT AND RADIO TRANSMISSION APPARATUS

CROSS-REFERENCE TO RELATED APPLICATIONS

This application is based upon and claims the benefit of priority from the prior Japanese Patent Applications No. 11-183223, filed Jun. 29, 1999; and No. 11-375483, filed Dec. 28, 1999, the entire contents of which are incorporated herein by reference.

BACKGROUND OF THE INVENTION

The present invention relates to a transmission circuit and a radio transmission apparatus in which there is a need to control the transmission output gain and, particularly to a digital transmission circuit and a digital radio transmission apparatus which are suitable for a mobile telephone and the like using a code division multiple access (CDMA) system.

The CDMA system is attracting attention as a signal modulation method suited for a large capacity radio transmission apparatus. In a radio transmission apparatus such as a mobile telephone using the CDMA system, the transmission output gain must be controlled in accordance with demands from a base station of a mobile telephone system.

FIG. 1 is a block diagram showing the constitution of a conventional transmission apparatus in a CDMA mobile telephone system.

An I-phase transmission data signal I-DATA and a Q-phase transmission data signal Q-DATA, which are orthogonal transmission signals output from a data processor (not shown in FIG. 1) and are spread-spectrum processed, are input to a modulator 51. The modulator 51 is an orthogonal modulator and modulates an intermediate frequency local oscillator signal output from a local oscillator 52, in accordance with the above-described orthogonal I-phase transmission data signal I-DATA and the Q-phase transmission data signal Q-DATA.

The modulator 51 supplies outputs to an IF-AGC amplifier (intermediate frequency automatic gain control amplifier) 53. In accordance with, for example, a gain adjustment demand signal (TX AGC ADJ1) from the base station, the IF-AGC amplifier 53 amplifies the modulated signal which has been input thereto at a gain determined by the gain adjustment demand signal TX AGC ADJ1 generated from the base station provided in the mobile telephone system. The IF-AGC amplifier 53 supplies outputs to an up-converter (frequency converter) 54.

A local oscillator signal generated from a TX-RF local oscillator 55 is input to the up-converter 54 which converts the frequency of the modulated signal in an intermediate frequency band to a signal in a transmission path frequency band.

A band-pass filter (BPF) 56 deletes unwanted frequency components from the modulated signal which has been converted to the transmission path frequency band to obtain an RF signal. Thereafter, the RF signal is input to a power control amplifier (PC-AMP) 57. The power control amplifier 57 amplifies the modulated signal input thereto to a gain determined by a gain adjustment signal TX AGC ADJ2 which is generated together with the gain adjustment signal TX AGC ADJ1. The power control amplifier 57 delivers outputs to a power amplifier (PA) 58. The power amplifier 58 amplifies the power of the modulated RF signal which is output from the power control amplifier 57. The RF signal which has been power-amplified by the power amplifier 58 is supplied to a transmission/reception antenna (not shown) for transmitting a corresponding electric wave into space.

In FIG. 1, the circuits including the modulator 51 and the IF-AGC amplifier 53 are integrated within the same integrated circuit.

In this conventional transmission apparatus, in attempting to control the transmission gain by using only the IF-AGC amplifier 53, when the power output from the power amplifier 58 is at its minimum, the up-converter 54 has a high noise figure (NF) of approximately 15 dB, and a power gain of approximately 10 dB. Consequently, the S/N ratio of the signal output from the up-converter 54 deteriorates, as does the waveform quality ρ (ratio of signal components to signal component+noise component: ρ=S/(S+N)). To solve such problems, in the circuit of FIG. 1 the gain of the power control amplifier 57 is made variable and is lowered in accordance with the gain adjustment signal TX AGC ADJ2.

Generally, the power control amplifier 57 has an NF of approximately 6 dB. Consequently, its gain is small and as long as the overall output gain is adjusted while reducing the noise of the up-converter 54, which is dominant in the transmission apparatus, it is possible to prevent the waveform quality from being deteriorated.

However, when the power control amplifier 57 is configured such that its gain can be controlled, the constitution becomes complex, increasing the cost of manufacturing the mobile telephone. Moreover, since the number of constituent parts increases, there is a problem that the external size of the constitution of the power control amplifier 57 becomes large.

Two control lines connected to the amplifiers 53 and 57 are needed for adjusting the respective gain. When attempting to use only one control line, an additional circuit becomes necessary, thereby further increasing the number of constituent parts and increasing the area of the IC circuit.

In addition, since the modulated signal which is amplified by the power control amplifier 57 has an RF high frequency and the output power is large, it is technically difficult to integrate the power control amplifier 57 with another IF-AGC amplifier 53 or the like to form a single integrated circuit.

This invention is made in consideration of the problems described above, and aims to provide a transmission circuit and a radio transmission apparatus which can be inexpensively manufactured without increasing their external sizes and are capable of obtaining a transmission output having a good waveform quality with low noise even when the gain is greatly adjusted.

It is another object of this invention to provide a frequency converter which can easily obtain a wide variable gain amplitude and can depress the NF when the gain is adjusted in the minimum range.

BRIEF SUMMARY OF THE INVENTION

The transmission circuit according to this invention comprises a modulating circuit which receives a data signal being transmitted and modulates an intermediate frequency signal in accordance with the data signal; an intermediate frequency amplifying circuit which receives and modulates an output from the modulating circuit, a gain of the intermediate frequency amplifying circuit being controlled in accordance with a first control signal; and a frequency converting circuit which receives an output from the intermediate frequency amplifying circuit and converting the output from the intermediate frequency amplifying circuit to a transmission frequency, the gain of the frequency converting circuit being controlled in accordance with a second control signal.

Furthermore, the radio transmission apparatus according to this invention comprises an intermediate frequency signal generating circuit which generates an intermediate frequency signal; a modulating circuit which receives a data signal being transmitted and the intermediate frequency signal, and modulates the intermediate frequency signal in accordance with the data signal; an intermediate frequency amplifying circuit which receives and modulates an output from the modulating circuit, a gain of the intermediate frequency amplifying circuit being controlled in accordance with a first control signal; a local oscillator signal generating circuit which generates a local oscillator signal; a frequency converting circuit which receives an output from the intermediate frequency amplifying circuit and the local oscillator signal and increases the frequency of the output of the intermediate frequency amplifying circuit to a transmission frequency, a gain of the frequency converting circuit being controlled in accordance with a second control signal; a filter circuit which receives an output of the frequency converting circuit; and a power amplifying circuit which amplifies an output of the filter circuit and has substantially a constant gain.

According to further aspect of the present invention, there is provided a frequency converting circuit for converting a frequency of a first input signal by using a second input signal, the frequency converting circuit comprising: a first frequency converting section comprising first and second transistors and third and fourth transistors, control terminals thereof being connected respectively to first and second input terminals to which the second input signal is supplied; a variable-gain first amplifying circuit comprising a fifth transistor which is commonly connected to one terminal of the first and third transistors, a sixth transistor which is commonly connected to one terminal of the second and fourth transistors, and a first variable-current circuit which is connected to the fifth and sixth transistors, the first input signal being supplied to control terminals of the fifth and sixth transistors; a first variable-current circuit controller which supplies a current control signal to the first variable-current circuit; a second frequency converting section comprising seventh and eighth transistors and ninth and tenth transistors, control terminals thereof being connected respectively to first and second input terminals to which the second input signal is supplied; and a constant-gain second amplifying circuit comprising an eleventh transistor which is commonly connected to one terminal of the seventh and ninth transistors, a twelfth transistor which is commonly connected to one terminal of the eighth and tenth transistors, and a current source which is connected to the eleventh and twelfth transistors, the first input signal being supplied to control terminals of the eleventh and twelfth transistors; an output being extracted from an output section comprising a common connection of other terminals of the second, third, eighth and ninth transistors.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Preferred embodiments of the present invention will be explained with reference to the drawings.

Figure 2:
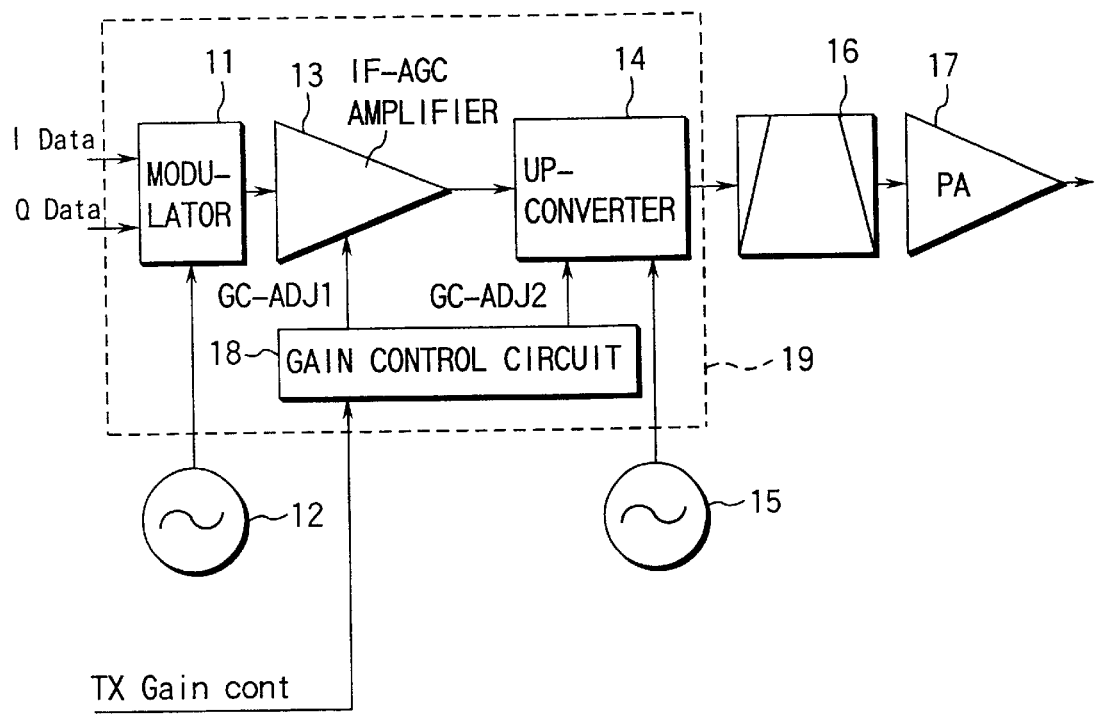
FIG. 2 is a block diagram showing a transmission apparatus according to a first embodiment of this invention which is applied in a CDMA mobile telephone system.

FIG. 2 is a block diagram showing a transmission apparatus according to a first embodiment wherein this invention is applied to a CDMA mobile telephone.

An I-phase transmission data signal I-DATA and a Q-phase transmission data signal Q-DATA are output from a data processor (not shown in FIG. 2) provided in the mobile telephone. The I-phase transmission data signal I-DATA and the Q-phase transmission data signal Q-DATA, which are spread-spectrum processed and have an orthogonal relationship to each other, are input to a modulator 11. A TX-IF local oscillator (intermediate frequency signal generating circuit) 12 outputs an intermediate frequency local oscillator signal to the modulator 11.

The modulator 11 modulates the intermediate frequency local oscillator signal output from the TX-IF local oscillator 12 in accordance with the orthogonal transmission data signals I-DATA and Q-DATA.

The modulator 11 delivers a modulated signal to an IF-AGC amplifier (intermediate frequency gain control amplifier) 13. The IF-AGC amplifier 13 amplifies the modulated signal which has been input thereto at a gain determined by a gain adjustment signal GC-ADJ1. The IF-AGC amplifier 13 outputs a modulated signal of an intermediate frequency to an up-converter 14 comprising a frequency converting circuit.

A TX-RF local oscillator (local oscillator signal generating circuit) 15 supplies a local oscillator signal to the up-converter 14. The up-converter 14 up-converts (frequency-converts) the frequency of the modulated signal in the intermediate frequency band to a signal in the transmission path frequency band. In addition, the up-converter 14 amplifies the modulated signal at a gain determined by a gain adjustment signal GC-ADJ2.

A band-pass filter (BPF) 16 deletes unwanted components from the modulated signal which has been up-converted to a transmission path frequency band (RF signal). Thereafter, the RF signal is input to a power amplifier (PA) 17. The power amplifier 17 amplifies the power of the modulated signal (RF signal) input thereto from the band-pass filter 16 at a fixed gain. The transmission signal which has been power-amplified by the power amplifier 17 is sent to a transmission/reception antenna and an electric wave corresponding to the transmission signal is radiated into space.

The gain adjustment signals GC-ADj1 and GC-ADj2 are output from a gain control circuit (control signal generating circuit) 18. A gain control signal TX Gain cont. is generated in the mobile telephone based on a gain adjustment demand transmitted from a base station, for example, and is input to the gain control circuit 18. Two threshold values V1 and V2 are set to a voltage level of the gain control signal TX Gain cont, and the gain control circuit 18 outputs the two gain adjustment signals GC-ADj1 and GC-Adj2 in accordance with the voltage level of the signal TX Gain cont.

In FIG. 2, the modulator 11, the IF-AGC amplifier 13, the up-converter 14 and the gain control circuit 18 included in the region enclosed by the broken line are integrated within the same integrated circuit 19.

Subsequently, the operation of the transmission apparatus configured as described above will be explained with reference to the characteristics diagrams of FIGS. 3A to 3C.

Figure 3A:
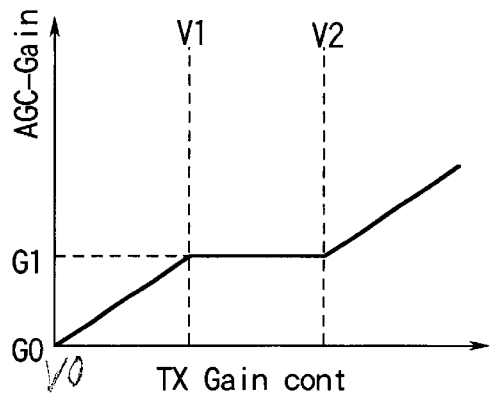
FIGS. 3A, 3B and 3C are characteristics diagrams showing examples of controlling gain in a gain controller of the transmission apparatus according to the first embodiment of this invention.

When the voltage level of the gain control signal TX Gain cont. input to the gain control circuit 18 changes from V0 to the threshold value V1, the gain control circuit 18 generates the gain adjustment signal GC-ADJ1 so that the gain AGC-Gain of the IF-AGC amplifier 13 increases linearly (monotonously) between G0 and G1 as shown in FIG. 3A. In addition, the gain control circuit 18 generates the other gain adjustment signal GC-ADJ2 so that the gain UC-Gain of the up-converter 14 remains constant at G2 as shown in FIG. 3B.

Moreover, when the voltage level of the gain control signal TX Gain cont. input to the gain control circuit 18 changes from the threshold value V1 to the other threshold value V2, the gain control circuit 18 generates the gain adjustment signal GC-ADJ1 so that the gain AGC-Gain of the IF-AGC amplifier 13 remains constant at G1 as shown in FIG. 3A. In addition, the gain control circuit 18 generates the other gain adjustment signal GC-ADJ2 so that the gain UC-Gain of the up-converter 14 increases linearly (monotonously) between G2 and G3 as shown in FIG. 3B.

Moreover, when the voltage level of the gain control signal TX Gain cont. input to the gain control circuit 18 changes from the other threshold value V2 to a value higher than V2, the gain control circuit 18 generates the gain adjustment signal GC-ADJ1 so that the gain AGC-Gain of the IF-AGC amplifier 13 increases linearly (monotonously) from G1 as shown in FIG. 3A. In addition, the gain control circuit 18 generates the other gain adjustment signal GC-ADJ2 so that the gain UC-Gain of the up-converter 14 remains constant at G3 as shown in FIG. 3B.

Figure 3B:
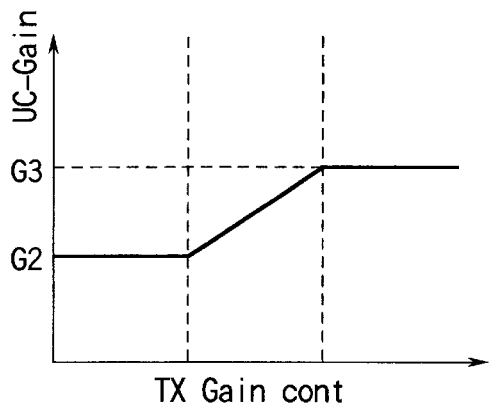
Figure 3C:
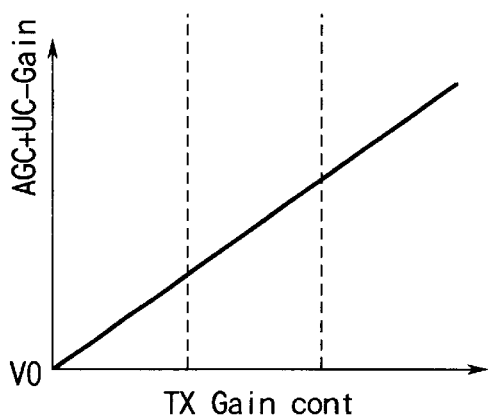

The total gain AGC+UC-Gain of the transmission apparatus comprises a synthesis of the gains of the IF-AGC amplifier 13 and the up-converter 14, and increases linearly (monotonously) as the voltage level of the gain control signal TX Gain cont. rises as shown in FIG. 3C.

According to the embodiment described above, when the gain G2 in the up-converter 14 is set minimum, the NF becomes as small as possible, thereby enabling the S/N of the signal output from the up-converter 14 to be improved and a signal output having good waveform quality to be obtained.

Unlike conventional devices, the present embodiment does not provide a power control amplifier and control the gain thereof. Since there is no need for a power control amplifier which has a complex constitution, it is possible to avoid increasing the manufacturing cost of the mobile telephone and increasing the external dimensions of the apparatus due to a greater number of constituent parts.

Since only one control signal line is required to input the signal for gain adjustment to the integrated circuit 19, the number of external connection terminals in the integrated circuit 19 can be reduced. Consequently, the external size can be further miniaturized and the cost of manufacturing can be further reduced.

Subsequently, a second embodiment of the invention will be explained.

The block constitution of the transmission apparatus according to the second embodiment is identical to that shown in FIG. 2, with the exception that the method for generating the gain adjustment signals GC-ADJ1 and GC-ADJ2 in the gain control circuit 18 differs from that in the case shown in FIG. 2. Therefore, only those points which differ from FIG. 2 will be explained below with reference to FIGS. 4A to 4C.

Figure 4A:
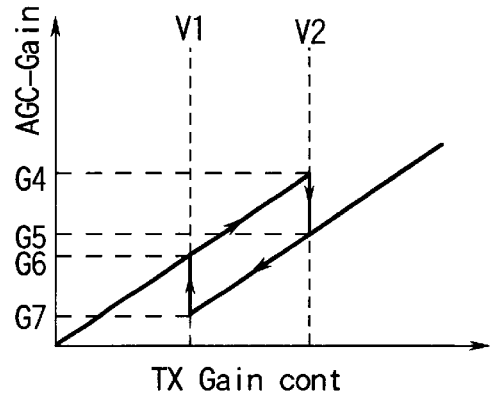
FIGS. 4A, 4B and 4C are characteristics diagrams showing examples of controlling gain in a gain controller of the transmission apparatus according to a second embodiment of this invention.
Figure 4B:
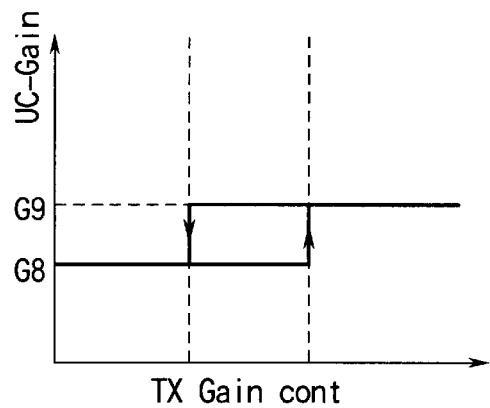

When the voltage level of the gain control signal TX Gain cont. input to the gain control circuit 18 changes from V0 to the other threshold value V2, the gain control circuit 18 generates the gain adjustment signal GC-ADJ1 so that the gain AGC-Gain of the IF-AGC amplifier 13 increases linearly (monotonously) from G0 to G4 while passing G6 as shown in FIG. 4A. In addition, the gain control circuit 18 generates the other gain adjustment signal GC-ADJ2 so that the gain UC-Gain of the up-converter 14 remains constant at G8 as shown in FIG. 4B.

Subsequently, when the voltage level of the gain control signal TX Gain cont. input to the gain control circuit 18 reaches the other threshold value V2, the gain control circuit 18 generates the gain adjustment signal GC-ADJ1 so that the gain AGC-Gain of the IF-AGC amplifier 13 immediately decreases from G4 to an even smaller gain of G5 as shown in FIG. 4A. In addition, the gain control circuit 18 generates the other gain adjustment signal GC-ADJ2 so that the gain UC-Gain of the up-converter 14 immediately increases from G8 to an even gain of G9 as shown in FIG. 4B.

When the voltage level of the gain control signal TX Gain cont. input to the gain control circuit 18 becomes even greater than the other threshold value V2, the gain control circuit 18 generates the gain adjustment signal GC-ADJ1 so that the gain AGC-Gain of the IF-AGC amplifier 13 increases linearly (monotonously) from G5 as shown in FIG. 4A. In addition, the gain control circuit 18 generates the other gain adjustment signal GC-ADJ2 so that the gain UC-Gain of the up-converter 14 remains constant at G9 as shown in FIG. 4B.

On the other hand, when the voltage level of the gain control signal TX Gain cont. input to the gain control circuit 18 changes from the other threshold value V2 by decreasing toward the threshold value V1, the gain control circuit 18 generates the gain adjustment signal GC-ADJ1 so that the gain AGC-Gain of the IF-AGC amplifier 13 passes G5 and decreases linearly (monotonously) to G7 which is even smaller than the earlier G6 as shown in FIG. 4A. In addition, the gain control circuit 18 generates the other gain adjustment signal GC-ADJ2 so that the gain UC-Gain of the up-converter 14 remains constant at G9 as shown in FIG. 4B.

When the voltage level of the gain control signal TX Gain cont. input to the gain control circuit 18 decreases as low as the threshold value V1, the gain control circuit 18 generates the gain adjustment signal GC-ADJ1 so that the gain AGC-Gain of the IF-AGC amplifier 13 immediately rises from G7 to G6 as shown in FIG. 4A. In addition, the gain control circuit 18 generates the other gain adjustment signal GC-ADJ2 so that the gain UC-Gain of the up-converter 14 immediately drops from G9 to G8 as shown in FIG. 4B.

Thereafter, when the voltage level of the gain control signal TX Gain cont. input to the gain control circuit 18 decreases even lower than the threshold value V1, the gain control circuit 18 generates the gain adjustment signal GC-ADJ1 so that the gain AGC-Gain of the IF-AGC amplifier 13 decreases linearly (monotonously) from G6 as shown in FIG. 4A. In addition, the gain control circuit 18 generates the other gain adjustment signal GC-ADJ2 so that the gain UC-Gain of the up-converter 14 remains constant at G8 as shown in FIG. 4B.

Figure 4C:
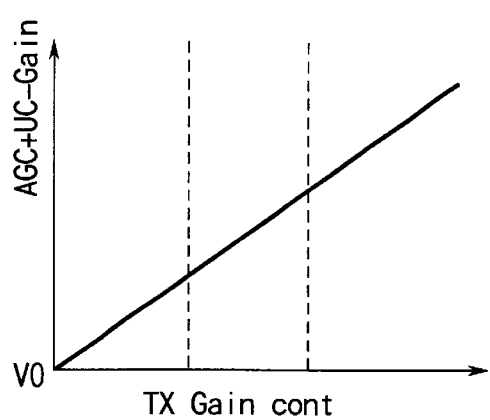

The total gain AGC+UC-Gain of the transmission apparatus is a synthesis of the gains of the IF-AGC amplifier 13 and the up-converter 14, and, as shown in FIG. 4C, the gain AGC+UC-Gain linearly increases as the voltage level of the gain control signal TX Gain cont. rises in the present embodiment also.

Similarly, in this second embodiment, the NF becomes as small as possible in the case where the minimum gain G2 is set in the up-converter 14, whereby the S/N of the signal output from the up-converter 14 can be improved and a signal output having good waveform quality can be obtained.

As in the first embodiment already described, the present second embodiment does not provide a power control amplifier and control the gain thereof. Since there is no need for a power control amplifier which has a complex constitution, it is possible to avoid increasing the manufacturing cost of the mobile telephone and increasing the external dimensions of the apparatus due to a greater number of constituent parts. Moreover, since only one control line is required to input the signal for gain adjustment to the integrated circuit 19, the number of external terminals in the integrated circuit 19 can be reduced, thereby obtaining the effects that the external size can be further miniaturized and the cost of manufacturing can be further reduced.

Figure 5:
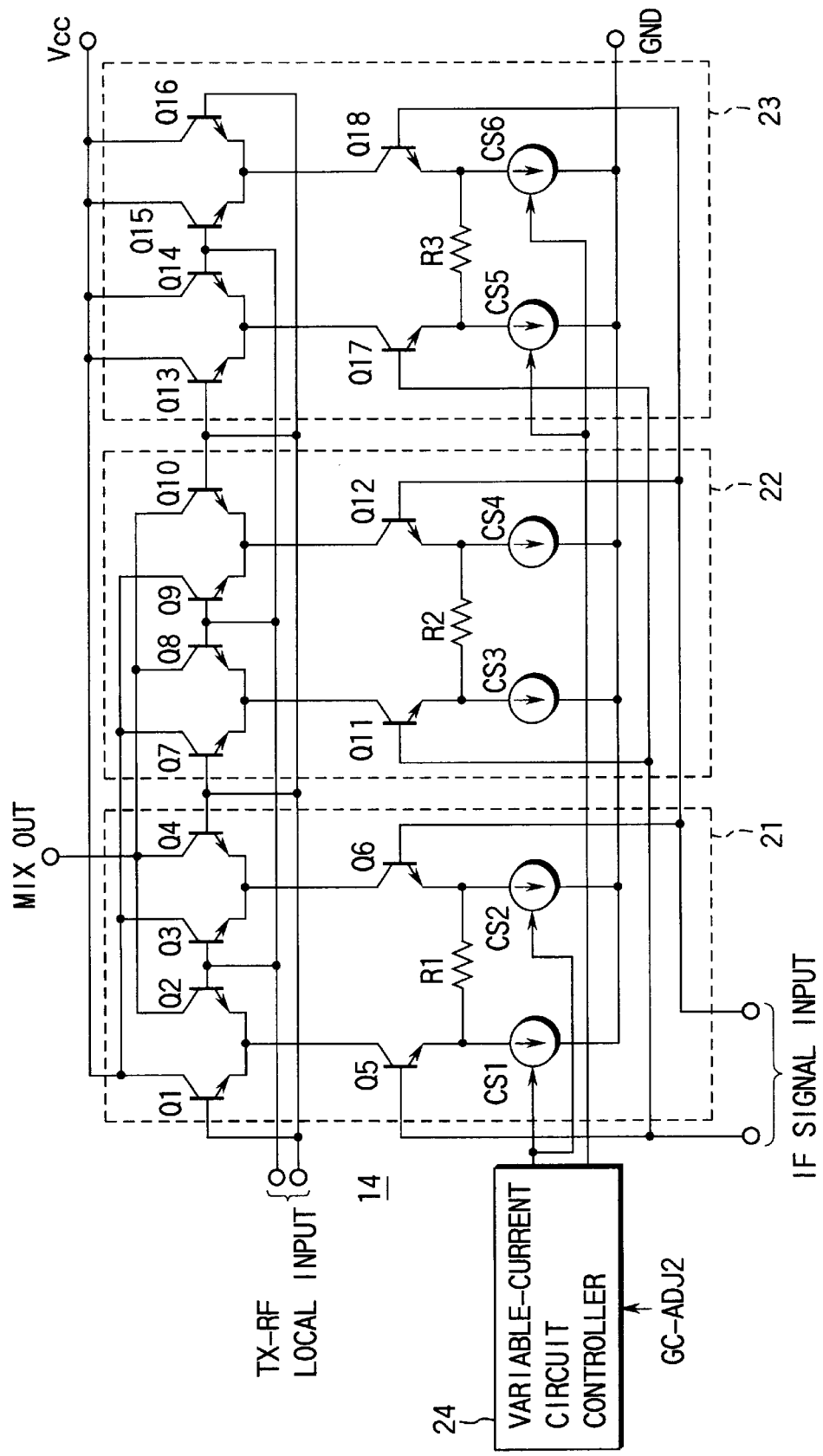
FIG. 5 is a circuit diagram showing one example of a specific constitution of an up-converter used in the transmission apparatus according to the first and second embodiments.

FIG. 5 is a circuit diagram showing one example of a specific constitution of the up-converter 14 used in the transmission apparatus of the first and second embodiments.

The up-converter 14 comprises first, second and third up-converter circuits 21, 22 and 23. The first up-converter circuit 21 comprises a conversion section comprising transistors Q1 to Q4, and an amplification section comprising transistors Q5 and Q6, variable-current circuits CS1 and CS2, and a resistor R1.

The second up-converter circuit 22 comprises a conversion section comprising transistors Q7 to Q10, and an amplification section comprising transistors Q11 and Q12, constant current sources CS3 and CS4, and a resistor R2.

The third up-converter circuit 23 comprises a conversion section comprising transistors Q13 to Q6, and an amplification section comprising transistors Q17 and Q18, variable-current circuits CS5 and CS6, and a resistor R3.

The up-converter 14 further comprises a variable-current circuit controller 24 which generates control signals for controlling the operation of the variable-current circuits CS1, CS2, CS5 and CS6, based on the gain adjustment signal GC-ADJ2 output from the gain control circuit 18.

A modulation signal (IF signal input) is output from the IF-AGC amplifier 13 and is supplied to the bases of the transistors Q5 and Q6, Q11 and Q12, and Q17 and Q18 in the amplification sections of the first, second and third up-converter circuits 21, 22 and 23 respectively. A local oscillation signal (TX-RF local input) at the transmission path frequency is output from the TX-RF local oscillator 15 and is supplied to the bases of the transistors Q1 and Q2, to the bases of the transistors Q3 and Q4, to the bases of the transistors Q7 and Q8, to the bases of the transistors Q9 and Q10, to the bases of the transistors Q13 and Q14, and to the bases of the transistors Q15 and Q16 in the respective conversion sections.

The output terminals (the collectors of the transistors Q2 and Q4, Q8 and Q10 in the conversion sections) of the first and second up-converter circuits 21 and 22 are commonly connected to an output terminal for output a modulated signal MIX OUT. The modulated signal MIX OUT which has been up-converted to the transmission path frequency band is output from the common output terminal.

The third up-converter circuit 23 is provided as a dummy, and the output terminal (the collector of the transistors Q14 and Q16 in the conversion section) of the up-converter circuit 23 is not connected to the output terminal for the modulated signal MIX OUT but is connected to a node for supplying a power voltage VCC.

The intermediate frequency gains in the first, second and third up-converter circuits 21, 22 and 23 are directly proportional to the value of the current flowing in the variable-current circuits CS1 and CS2, the constant current sources CS3 and CS4, and the variable-current circuits CS5 and CS6 in the respective amplification sections thereof. Here, the relationship between the current values ICS1 and ICS2 of the variable-current circuits CS1 and CS2 in the first up-converter circuit 21 is ICS1=ICS2, and in addition, the relationship between the current values ICS5 and ICS6 of the variable-current circuits CS5 and CS6 in the third up-converter circuit 23 is ICS5=ICS6. Moreover, the operation of the variable-current circuits CS1, CS2, CS5 and CS6 is controlled by the control signals output from the variable-current circuit controller 24 so that the value ICS1+ICS2+ICS5+ICS6 is approximately constant.

In the circuit of this constitution, in the region where the voltage level of the gain control signal TX Gain cont. is lower than the threshold value V1, the current values ICS1 and ICS2 of the variable-current circuits CS1 and CS2 in the amplification section of the first up-converter circuit 21, which functions as a gain adjustment stage, are controlled so as to have minimum values. Constant currents flow to the constant current sources CS3 and CS4 in the amplification section of the second up-converter circuit 22, and consequently the total gain of the up-converter 14 maintains a constant value G2 as shown, for example, in FIG. 3B.

The third up-converter circuit 23 is a dummy circuit which operates as a compensation circuit for compensating the load fluctuation at the TX-RF local input terminals as described in the specification.

In the up-converter 14 shown in FIG. 5, the gain is made variable in the first up-converter circuit 21 and constant in the second up-converter circuit 22 to substantially divide the up-converter 14 into two sections, i.e., into the first and second up-converter circuits 21 and 22.

In FIG. 5, the signal output from the third up-converter circuit 23 does not contribute to the gain of the modulated signal (MIX OUT) which is up-converted.

There are two reasons for dividing the up-converter 14 into two practical blocks to form a mixer in this way.

Firstly, when the gain of an up-converter is greatly changed (decreased), the collector current Ic must be reduced to an extreme degree as will be explained later. As can be understood from FIG. 6, the transition frequency fT of the transistor consequently decreases and it is not possible to obtain the frequency characteristics needed at the minimum gain.

Secondly, noise cannot be reduced in the region of minimum gain, and with only one block the NF is worse than when the up-converter is divided into two practical blocks, sometimes resulting in a failure to obtain the desired characteristics.

The same may be said in the case when transistors Q1 and Q7, Q2 and Q8, Q3 and Q9, Q4 and Q10 of FIG. 5 are respectively combined to form single transistors and a circuit comprising four elements.

Figure 6:
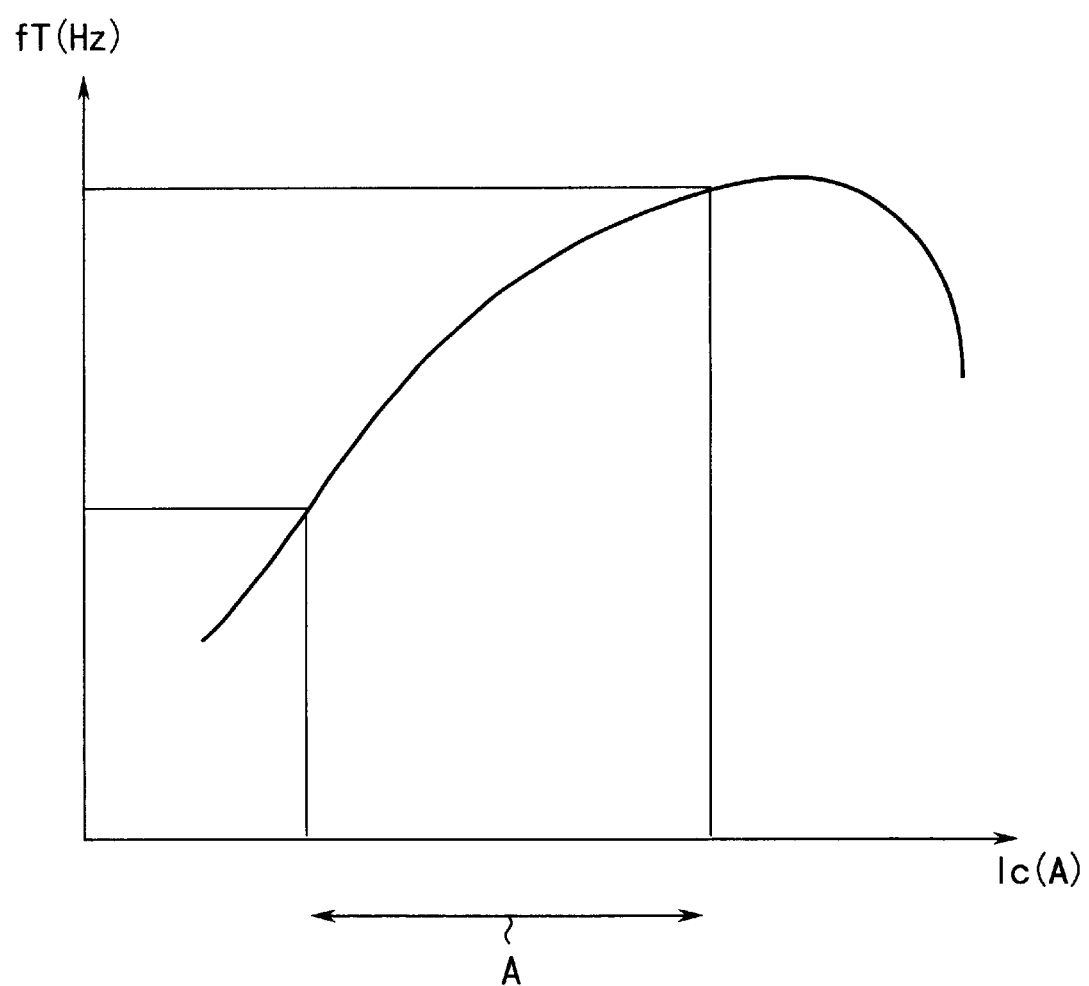
FIG. 6 is a characteristics graph showing the relationship between the transition frequency and the collector current of a transistor.

FIG. 6 shows the relationship between the collector current Ic (A) and the transition frequency fT (Hz). The transition frequency fT is often determined by the value of a frequency at which the absolute value of the current gain is 1, of a short-circuited common-emitter transistor. When the transistor is used as an amplifier, the transition frequency fT is used as an indication of the maximum frequency fTmax for giving an indication of the practical frequency response capability of the transistor.

In the up-converter 14 of FIG. 5, in the second up-converter circuit 22 wherein gain is constant even in the region below the threshold value V1, the amount of current does not change and the transition frequency is always constant. Therefore, as long as the first up-converter circuit 21 is used in the region A of the collector current Ic in which the transition frequency fT changes approximately linearly in FIG. 6, the desired frequency characteristics can be achieved.

In the case when the voltage level of the gain control signal TX Gain cont. exceeds the threshold value V1, the values ICS1 and ICS2 of the current flowing in the variable-current circuits CS1 and CS2 in the amplification section of the first up-converter circuit 21 increase sequentially. As a consequence, the total gain UC-Gain of the up-converter 14 increases monotonously from G2 as, for example, shown in FIG. 3B.

In the case when the voltage level of the gain control signal TX Gain cont. exceeds the other threshold value V2, the values ICS1 and ICS2 of the current flowing in the variable-current circuits CS1 and CS2 in the amplification section of the first up-converter circuit 21 are controlled to reach to their maximum values. As a consequence, the total gain UC-Gain of the up-converter 14 is constant at G3 as, for example, shown in FIG. 3B.

On the other hand, as the values ICS1 and ICS2 of the current flowing in the variable-current circuits CS1 and CS2 in the amplification section of the first up-converter circuit 21 increase sequentially, the values ICS5 and ICS6 of the current flowing in the variable-current circuits CS5 and CS6 in the amplification section of the third up-converter circuit 23 decrease sequentially. The output terminal of the conversion section of the third up-converter circuit 23 is not connected to the output terminals of the conversion sections of the first and second up-converter circuits 21 and 22. Therefore, the signal output from the third up-converter circuit 23 does not contribute to changes in the gain of the modulated signal (MIX OUT) which is up-converted.

However, when controlling the gain of the first up-converter circuit 21 in the up-converter 14, in the conversion section to which the gain control signal TX Gain cont. is supplied via the gain control circuit, fluctuation of the current flowing in the amplification section causes the load of the TX-RF local input terminal to fluctuate. Fluctuation of the load of the TX-RF local input terminal affects the local oscillator signal (TX-RF local input) generated by the TX-RF local oscillator 15, resulting in deviation in the local oscillating frequency and sometimes making transmission impossible.

Accordingly, in the circuit of FIG. 5, the third up-converter circuit 23 is provided as a dummy up-converter circuit and is controlled such that the current flowing in the amplification section of the third up-converter circuit 23 decreases when the current flowing in the amplification section of the first up-converter circuit 21 increases. Conversely, the current flowing in the amplification section of the third up-converter circuit 23 increases when the current flowing in the amplification section of the first up-converter circuit 21 decreases. Thus the current values are changed so as to complement each other, whereby the value of the current flowing in all the amplification sections is kept approximately constant.

As a result, even when the currents flowing in the amplification sections of the first and third up-converter circuits 21 and 23 individually fluctuate, the total value of the current flowing in the amplification sections of the three up-converter circuits 21 to 23 does not fluctuate but is always constant. It is therefore possible to reduce fluctuation in the load of the TX-RF local input terminal to which all three conversion sections of the first, second and third up-converter circuits 21, 22 and 23 are connected. As a result, there is no danger of deviation in the oscillating frequency of the TX-RF local oscillator 15 which generates the local oscillator signal (TX-RF local input), thereby reducing the possibility of transmission failure. Of course, a circuit may be formed by connecting the dummy circuit and the fixed-gain transistors Q7 and Q13, Q8 and Q14, Q9 and Q15, Q10 and Q16 in respective single transistors. However, as mentioned above, when the circuit is operated at minimum gain, it may not be possible to obtain the desired characteristics because the increased noise may adversely affect the NF, thereby resulting in a failure to obtain the desired frequency characteristics. For these reasons, such a circuit constitution is not effective.

The above explanation of the circuit shown in FIG. 5 described a case where the gain UC-Gain of the up-converter 14 changed monotonously between the threshold values V1 and V2 of the voltage levels of the gain control signal TX Gain cont. as shown earlier in FIG. 3B, but in the second embodiment the variable-current circuit controller 24 outputs a control signal such that the gain UC-Gain changes in step like between the threshold values V1 and V2 of the voltage levels of the gain control signal TX Gain cont. as shown earlier in FIG. 4B. Nevertheless, in view of the load fluctuation (TX-RF local input terminal), it is more effective to change the gain UC-Gain of the up-converter 14 monotonously as shown in FIG. 3B, rather than in step like as shown in FIG. 4B. That is, the load of the TX-RF local input terminal is unlikely to fluctuate since the gain UC-Gain of the up-converter 14 does not move in step like. Unlike the constitution of FIG. 4B there is no hysteresis in the case of FIG. 3B, thereby completely eliminating the possibility of discontinuous gain control characteristics with the IF-AGC amplifier 13.

On the other hand, in the up-converter 14 of the above-described first and second embodiments, although no particular problems arise as long as the transition frequency fT of the transistor can be sufficiently maintained within a range of current change which corresponds to the necessary range of variable gain amplitude, as shown in FIG. 6 representing the characteristics of the collector current Ic and the transition frequency fT, when the current is reduced to lessen the gain to achieve a further wider variable gain range, the transition frequency fT may decrease considerably. As a result, a transmission circuit having the desired characteristics cannot easily be realized since it is necessary to use a transistor having the extremely large maximum frequency fTmax for maintaining a high quality transmission. Such a transistor should be manufactured by using a high cost process. Therefore, it becomes impossible to perform transmission at the predetermined transmission frequency without using an expensive transistor.

According to a third embodiment, a plurality of up-converter circuits each having a gain variable width which is less than a predetermined value are provided in the up-converter, and control voltages supplied to each of the up-converter circuits are set within mutually different voltage ranges to set different gain control regions. As a consequence, there is no longer any need to reduce the collector current Ic of the transistors in the up-converter circuits to an extremely low value and the transistors can be driven in the linear range A shown in FIG. 6. Therefore, the transition frequency fT does not affect the transmission characteristics and the gain can be easily adjusted. For example, the constitution can be such that the variable gain amplitude of each of the up-converter circuits is set to less than 6 dB, obtaining an overall variable gain amplitude of approximately 18 dB.

In order to change the gain in a stable manner by using the up-converter, it is necessary to use a region in which fT changes linearly with respect to the collector current Ic, such as the region A of FIG. 6. When the relationship between the Ic and the gain of the up-converter is linear, it is clear that, for example, the fT will decrease to approximately half its value when the Ic decreases to half its value.

A case will be described in detail in which the gain of the frequency conversion section comprising the transistors Q1 to Q4 of the up-converter circuit 21 in the embodiment of FIG. 5 is made variable.

Generally, the emitter resistance re of a transistor is expressed as: re=α0/gm (wherein α0 represents the current amplification rate, and gm represents the mutual conductance). Since an approximation of α0≅1 is permissible and gm=Ic/VT (where VT represents the thermal voltage≅26 mV), the relationship becomes re=VT/Ic.

In the case of the up-converter circuit 21, the distortion of the output signal must be reduced. This is often achieved by inserting a resistance for negative feedback R1 in order to increase the range within the voltage input between the bases of the transistors Q5 and Q6 can be linearly processed.

On the other hand, the gain A of the conversion section (transistors Q1 to Q4) is expressed as a relationship between the emitter resistance re and the resistance for negative feedback R1 as follows: A∝1/(2re+R1).

For example, consider a conversion section having a variable gain amplitude of −6 dB (approximately one-half). Assuming that the currents flowing in the variable-current circuits CS1 and CS2 at maximum gain are ICS1=ICS2=2.6 mA, the emitter resistance re becomes: re=10Ω.

When R1=50Ω, from the following relationship $$1/(2re+R1):1/(2re'+R1)=1:1/2,$$

re=45Ω is obtained. Hence ICS1'=ICS2'≅0.58 mA, requiring a current which is approximately 1/4.5 that of the original current of 2.6 mA.

Therefore, in a case where the frequency conversion section (Q1 to Q4) is operated at, for example, a frequency of 1 GHz when ICS1'=ICS2'≅0.58 mA, the constitution at the minimum fT can be fT=4.5 GHz. Consequently, sufficiently linear gain characteristics can be obtained as long as fT=approximately 10 GHz.

The same method can of course be used to calculate the variable range of the current amplitude and the necessary fT for a circuit in which distortion need not be reduced, such as the modification of the up-converter circuit 21 of FIG. 5 shown in FIG. 12 which will be explained later.

Similarly, when ICS1=ICS2=2.6 mA, re=10Ω, R1=50Ω, and gain is changed to −18 dB (approximately one-eighth), from the following equation $$1/(2re+R1):1/(2re'+R1)=1:1/8,$$

re=255Ω is obtained. Accordingly, ICS1"=ICS2"=0.1 mA should be set. Thus, the original current of 2.6 mA must be reduced to one-twenty-sixth (1/26) of its value.

Therefore, considering a case where the frequency conversion section (Q1 to Q4) is operated at, for example, a frequency of 1 GHz when ICS1"=ICS2"=0.1 mA, the fT of the transistors must be increased by approximately 26 times. That is, transistors having characteristics of fT≅26 GHZ are required. In practice, an expensive process for manufacturing a transistor having a characteristic fT≧30 GHz is needed.

Figure 7:
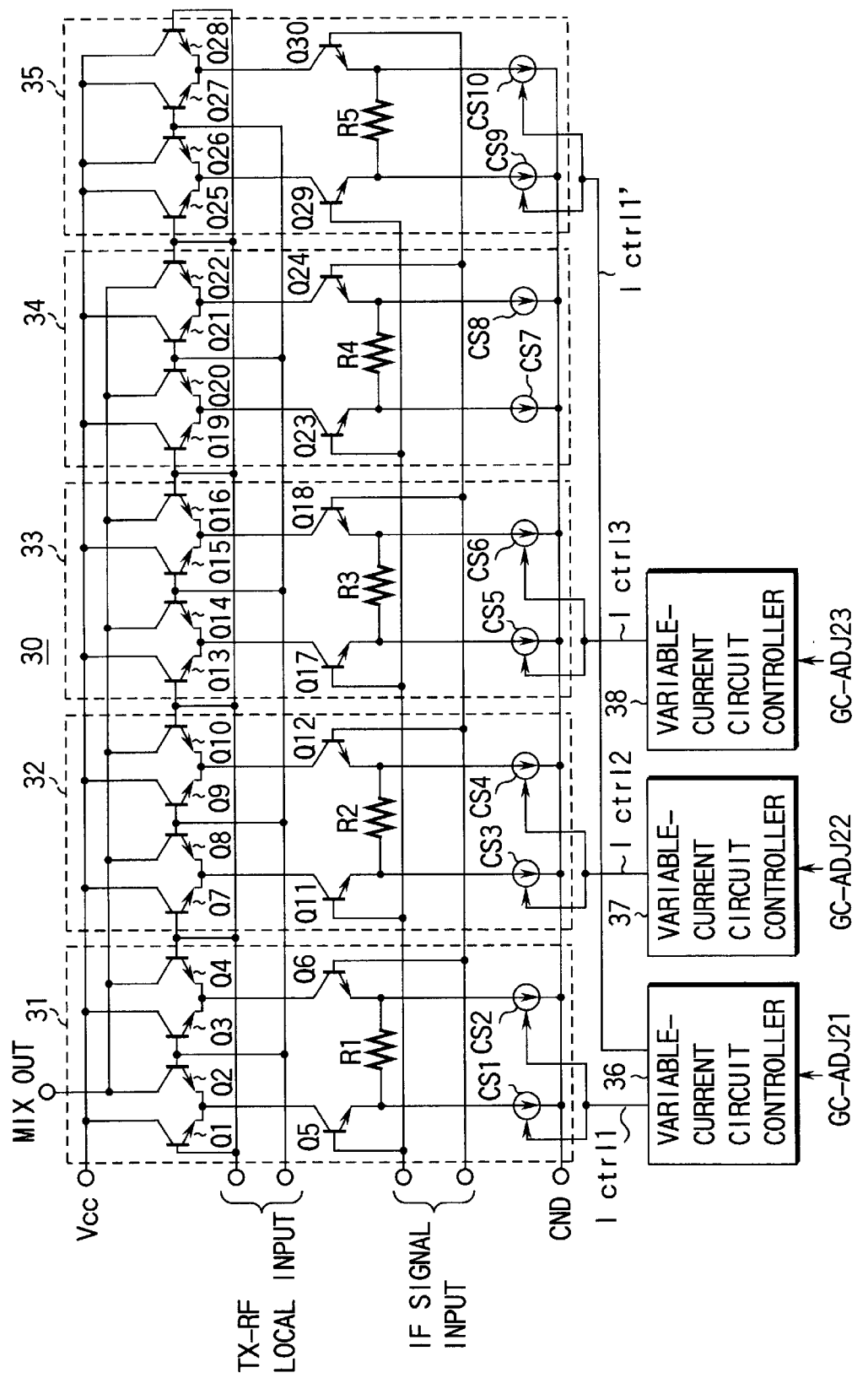
FIG. 7 is a circuit diagram showing one example of a specific constitution of an up-converter used in the transmission apparatus according to a third embodiment.

As shown in FIG. 7, this invention comprises a plurality of variable-gain up-converter circuits, i.e. multiple frequency conversion sections (three in FIG. 7), to achieve the constitution using transistors manufactured by an inexpensive process of fT=approximately 10 GHZ, even in the case where the variable gain amplitude has been increased.

A specific circuit constitution of the third embodiment of this invention will be explained with reference to the block diagram shown in FIG. 7.

The circuit of FIG. 7 is constituted by replacing the section comprising the up-converter 14 in the embodiment shown in FIG. 2. Since the other sections of the constitution of the circuit in FIG. 7 are identical to those in FIG. 2, only the replaced constitution is shown.

The up-converter 30 of FIG. 7 comprises four up-converter circuits 31, 32, 33 and 34, the output sections thereof being commonly connected to an output terminal MIX OUT; and a dummy up-converter circuit 35 for complementing load fluctuation. The up-converter 30 further comprises variable-current circuit controllers 36, 37 and 38 which supply control signals to the variable-current circuits CS1 to CS6, CS9 and CS10 of the up-converter circuits 31 to 33 and the dummy up-converter circuit 35 respectively.

An external source, e.g. a base station, supplies a gain control signal TX Gain cont. to a gain control circuit which is not shown in the diagram. The gain control circuit outputs a gain adjustment signal GC-ADJ1 which is for example identical to that supplied to the IF-AGC amplifier 13 in the embodiment of FIG. 2. In addition, gain adjustment signals GC-ADJ21, GC-ADJ22 and GC-ADJ23 are output to variable-current circuit controllers 36, 37 and 38 shown in FIG. 7. The variable-current circuit controllers 36 to 38 generate control signals Ictrl1, Ictrl2, Ictrl3, and Ictrl1' which are current signals supplied to the variable-current circuits CS1 to CS6, CS9 and CS10 of the multiple (four in this case) up-converter circuits 31 to 33 and 35. These control signals Ictrl1, Ictrl2, Ictrl3, and Ictrl1' have characteristics of, for example, those shown in FIG. 9 described later.

The up-converter 30 comprises first, second, third, fourth and fifth up-converter circuits 31, 32, 33, 34 and 35. The first up-converter circuit 31 comprises a conversion section comprising transistors Q1 to Q4, and an amplification section comprising transistors Q5 and Q6, variable-current circuits CS1 and CS2 and a resistance R1. The second up-converter circuit 32 comprises a conversion section comprising transistors Q7 to Q10, and an amplification section comprising transistors Q11 and Q12, variable-current circuits CS3 and CS4 and a resistance R2. The third up-converter circuit 33 comprises a conversion section comprising transistors Q13 to Q16, and an amplification section comprising transistors Q17 and Q18, variable-current circuits CS5 and CS6, and a resistance R3. The fourth up-converter circuit 34 comprises a conversion section comprising transistors Q19 to Q22, and an amplification section comprising transistors Q23 and Q23, constant current sources CS7 and CS8, and a resistance R4. The fifth up-converter circuit 35 comprises a conversion section comprising transistors Q25 to Q28, and an amplification section comprising transistors Q29 and Q30, variable-current circuits CS9 and CS10, and a resistance R5.

The up-converter 30 further comprises variable-current circuit controllers 36 to 38 which generate control signals Ictrl1 to Ictrl3 and Ictrl1' for controlling the operation of the variable-current circuits CS1, CS2, CS3, CS4, CS5, CS6, CS9 and CS10 based on gain adjustment signals GC-ADJ1 to GC-ADJ23 output from the gain control circuit.

A modulated signal (IF signal input) output from the IF-AGC amplifier 13 is supplied across the bases of the transistors Q5 and Q6, Q11 and Q12, Q17 and Q18, Q23 and Q24, Q29 and Q30 of the amplification sections of each of the first to fifth up-converter circuits 31 to 35.

A local oscillation signal (TX-RF local oscillation input) at the transmission path frequency is output from the TX-RF local oscillator 15 and supplied across the bases of the transistors Q1 and Q2, Q3 and Q4, Q7 and Q8, Q9 and Q10, Q13 and Q14, Q15 and Q16, Q19 and Q20, Q21 and Q22, Q25 and Q26, and Q27 and Q28 in the conversion sections of each of the first to fifth up-converter circuits 31 to 35, respectively.

Moreover, the output terminals (the collectors of the transistors Q2 and Q4, Q8 and Q10, Q14 and Q16, and Q20 and Q22 in the conversion sections) of the first to fourth up-converter circuits 31 to 34 are commonly connected, and modulated signal (MIX OUT) which has been up-converted to the transmission path frequency band is output from this common output terminal.

The fifth up-converter circuit 35 is provided as a dummy, and the collectors of the transistors Q25 to Q28 in the conversion section of the up-converter circuit 35 is not connected to an output terminal for the modulated signal MIX OUT but connected to a node for supplying a power voltage VCC.

As a result, there is no danger of deviation in the oscillating frequency of the TX-RF local oscillator 15 which generates the local oscillator signal (TX-RF local input), thereby reducing the possibility of transmission failure. Of course, in this case the circuit may be configured by combining the corresponding transistors of the dummy circuit 35 and the fixed-gain circuit 34 such that the transistors Q19 and Q25, Q20 and Q26, Q21 and Q27, Q22 and Q28 are configured as single transistors, respectively. However, as mentioned above, at minimum gain it may not be possible to obtain the desired frequency characteristics and increased noise may adversely affect the NF, resulting in a failure to obtain the desired transmission characteristics. For these reasons, such a circuit constitution is not effective.

In other words, the effect of reducing the NF at minimum gain can be obtained by dividing the up-converter into at least the two blocks 34 and 35 in this way.

The intermediate frequency gains in the first to third and the fifth up-converter circuits 31, 32, 33 and 35 are directly proportional to the values of the currents flowing in the variable-current circuits CS1 and CS2, CS3 and CS4, CS5 and CS6, and CS9 and CS10 in the respective amplification sections thereof.

The relationships between the current values ICS1 and ICS2, ICS3 and ICS4, and ICS5 and ICS6 of the variable-current circuits CS1 and CS2, CS3 and CS4, and CS5 and CS6 in the first to third up-converter circuits 31 to 33 are ICS1=ICS2, ICS3=ICS4, and ICS5=ICS6. In addition, the relationship between the current values ICS9 and ICS10 of the variable-current circuits CS9 and CS0 in the fifth up-converter circuit 35 is ICS9=ICS10. Moreover, the operations of the variable-current circuits CS1 and CS2, CS9 and CS10 are controlled by two types of control signals Ictrl1 and Ictrl1' which are output from the variable-current circuit controller 36 so that the total value ICS1+ICS2+ICS9+ICS10 is approximately constant.

Figure 8:
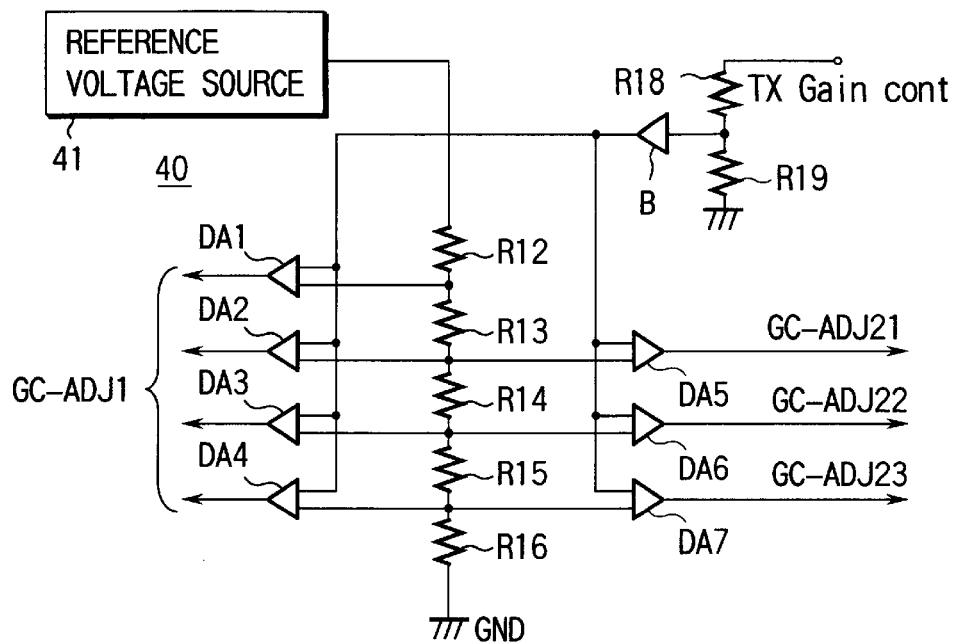
FIG. 8 is a block diagram showing a specific example of a gain controller.

One example of an internal constitution of a gain control circuit in the third embodiment will be explained with reference to FIG. 8. This gain control circuit comprises resistors R12 to R16 which are connected in series between a reference voltage source 41 and a ground terminal GND. Divided reference voltages are supplied from the connection nodes of the resistors R12 and R13, the resistors R13 and R14, the resistors R14 and R15, and the resistors R15 and R16 to first input terminals of differential amplifiers DA1, DA2, DA3 and DA4, respectively. In addition, the connection nodes of the resistors R13 and R14, the resistors R14 and R15, and the resistors R15 and R16 are connected to first input terminals of a further three differential amplifiers DA5, DA6 and DA7 respectively.

The gain control signal TX Gain cont. of FIG. 2 which is generated based on a gain adjustment command from the base station is divided by a voltage divider comprising the resistors R18 and R19 and supplied commonly via a buffer B to the second input terminals of the differential amplifiers DA1 to DA4. The output from the buffer B is supplied commonly to the other input terminals of the differential amplifiers DA1 to DA7.

A voltage signal generated from the buffer B based on the gain control signal TX Gain cont. is supplied to the differential amplifiers DA1, DA2, DA3, and DA4, and is compared with the respective reference voltages which have been divided by the resistors R12 to R16. Four outputs are produced from the differential amplifiers DA1 to DA4 in accordance with the value of the gain control signal TX Gain cont., and this is supplied to the IF-AGC amplifier 13 of FIG. 2 as the first gain control signal GC-ADJ1.

Three outputs are produced from the differential amplifiers DA5 to DA7 in accordance with the value of the gain control signal TX Gain cont., and are supplied respectively to the variable-current circuit controllers 36 to 38 of FIG. 7 as the second gain control signals GC-ADJ21, GC-ADJ22 and GC-ADJ23.

By configuring the gain control circuit 40 in this way, the gain control signals GC-ADJ1 and GC-ADJ21 to GC-ADJ23 can be generated while using the reference voltage source 41 commonly for the IF-AGC amplifier and the up-converter. Since the voltage divider comprising the resistors R12 to R16 is used as a common reference voltage source for the differential amplifiers DA1 to DA7, the circuit constitution is simple and can be integrated in a single integrated circuit with the IF-AGC amplifier 13 and the up-converter 14, thereby facilitating miniaturization.

The advantage of the present invention will further be explained by referring to FIG. 7 assuming that three up-converter circuits, each has a variable-gain amplitude of 6 dB with respect to a total variable-gain amplitude of 18 dB. The first up-converter circuit 31 reduces the maximum gain by 6 dB; the next up-converter circuit 32 reduces the gain by a further 6 dB, and the third up-converter circuit 33 reduces the gain by yet another 6 dB. The fourth up-converter circuit 34 is a fixed-gain frequency converting circuit for maintaining a minimum gain.

The relationship between the drive currents ICS1 to ICS6 of the variable-current circuits CS1, CS2, CS3, CS4, CS5 and CS6 of the up-converter circuits 31 to 33 is: ICS1=ICS2, ICS3=ICS4, ICS5=ICS6. As long as the relationship between the resistances of the negative-feedback resistors R1 to R3 is kept at R1:R2:R3=1:2:4, the relationship between the drive currents becomes ICS1:ICS3:ICS5=4:2:1. Hence $A \propto 1/(2re+R1)$ and the gains in the up-converter circuits 31 to 33 can be sequentially controlled by 6 dB, respectively. Incidentally, the area ratios of the transistors which constitute the up-converter circuits 31 to 33 must match each of the drive current ratios.

Figure 12:
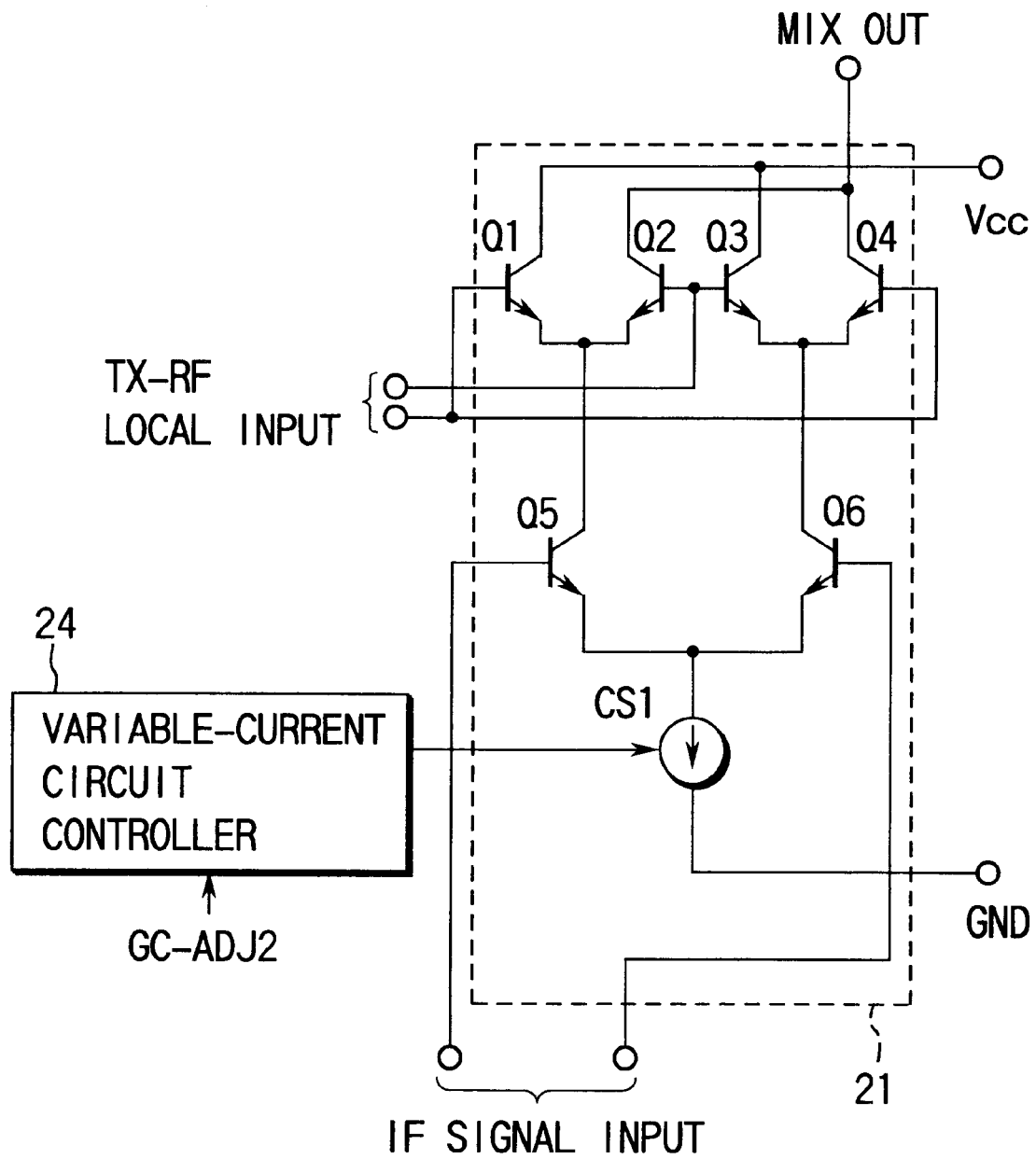
FIG. 12 is a circuit diagram showing yet another example of the frequency converter shown in FIG. 5 and FIG. 7.

The up-converter circuit 21 having the constitution shown in FIG. 12 can be used as the up-converter circuits 31 to 33. In that case, the variable-current circuits of the up-converter circuits 31 to 33 respectively comprise only the variable-current circuits CS1, CS3 and CS5 shown in FIG. 7. The ratio of each of the drive currents in this case needs only be ICS1:ICS3:ICS5=4:2:1.

Figure 9:
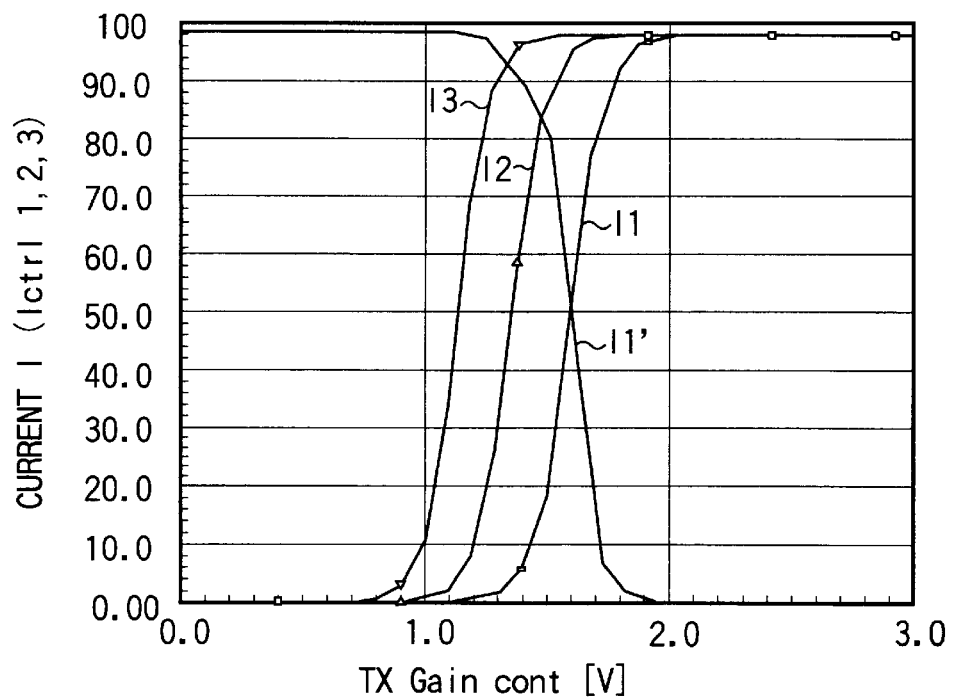
FIG. 9 is a graph showing the relationship between a gain control signal and a control signal supplied to the current-variable circuit of an up-converter.

As shown in FIG. 9, amounts of currents I (=Ictrl 1,2,3) are changed within mutually equal current ranges by the gain control signal TX Gain cont. supplied from the outside, and are used as control signals for the variable-current circuits CS1, CS3 and CS5. A current of 4nI flows to the variable-current circuit CS1, a current of 2nI flows to CS3, and a current of nI (n being a positive integer number) flows to CS5.

With this constitution, it is possible to realize a frequency converting circuit wherein, even when the gain is reduced by 6 dB so that no current flows to the conversion sections Q1 to Q4 of the up-converter circuit 31, currents at maximum gain flows in the transistors Q7 to Q10, Q13 to Q16 and Q19 to Q22 of the conversion sections of the up-converter circuits 32, 33 and 34, and consequently the circuits are not affected by the fT. Similarly, even when the up-converter circuit 32 reduces the gain by 6 dB, the remaining transistors Q13 to Q16 and Q19 to Q22 of the conversion sections of the up-converter circuits 33 and 34 are not affected by the fT. Moreover, even when the up-converter circuit 33 further reduces the gain by 6 dB, the transistors Q19 to Q22 of the conversion section of the up-converter circuit 34 are not affected by the fT.

That is, since the range of change of the current amount in each conversion section can be reduced, it is possible to realize a frequency converting circuit constituted by low-fT transistors having a wider variable gain than when gain is varied by using a single up-converter.

In this example, the fixed-gain up-converter circuit 34 is provided in parallel, but the same effects can be obtained by providing a fixed-current source in parallel with the variable-current circuits CS5 and CS6 of the up-converter circuit 33. However, inserting the fixed-gain up-converter circuit 34 affects the increase of the fT of the transistors at minimum gain.

FIG. 9 is a graph showing an example of the relationship between current source control signals Ictrl1, Ictrl2 and Ictrl3 (A) which are output from the variable current controllers 36 to 38 in the circuit of FIG. 7 and the gain control signal TX Gain cont. (V). The minimum current value of each current is 0 and the maximum is 100.

In FIG. 9, the curve I1 represents the current amount of the control signal Ictrl1 which is applied to the variable-current circuits CS1 and CS2 of the up-converter circuit 31; the curve I2 represents the current amount of the control signal Ictrl2 which is applied to the variable-current circuits CS3 and CS3 of the up-converter circuit 32; and the curve I3 represents the current amount of the control signal Ictrl3 which is applied to the variable-current circuits CS5 and CS6 of the up-converter circuit 33. The curve I1' represents the current amount of the control signal Ictrl1' which is supplied to the current sources CS9 and CS10 of the dummy up-converter circuit 35.

As is clear from FIG. 9, when the voltage of the gain control signal TX Gain cont. is 0, almost no control current is supplied to the current sources CS1 to CS6 of the up-converter circuits 31 to 33. On the other hand, maximum control current is supplied to the current sources CS9 and CS10 of the dummy up-converter circuit 35, canceling the minimum control current amount in the curves I1 to I3 and maintaining balance.

As the voltage of the gain control signal TX Gain cont. increases, the control current I3 to the current sources CS5 and CS6 of the up-converter circuit 33 first start to increase.

When the current I3 reaches at its maximum value, the control current I2 to the up-converter circuit 32 starts to increase. When the current I2 reaches at its maximum value, the control current I1 of the next up-converter circuit 31 starts to increase. Simultaneously, the control current I1' to the dummy up-converter circuit 35 starts to decrease, and the currents I1 and I1' become approximately equal to each other at scale 50 which is half of the maximum. When the current I1 reaches its maximum value, the dummy current I1' becomes zero.

Figure 1:
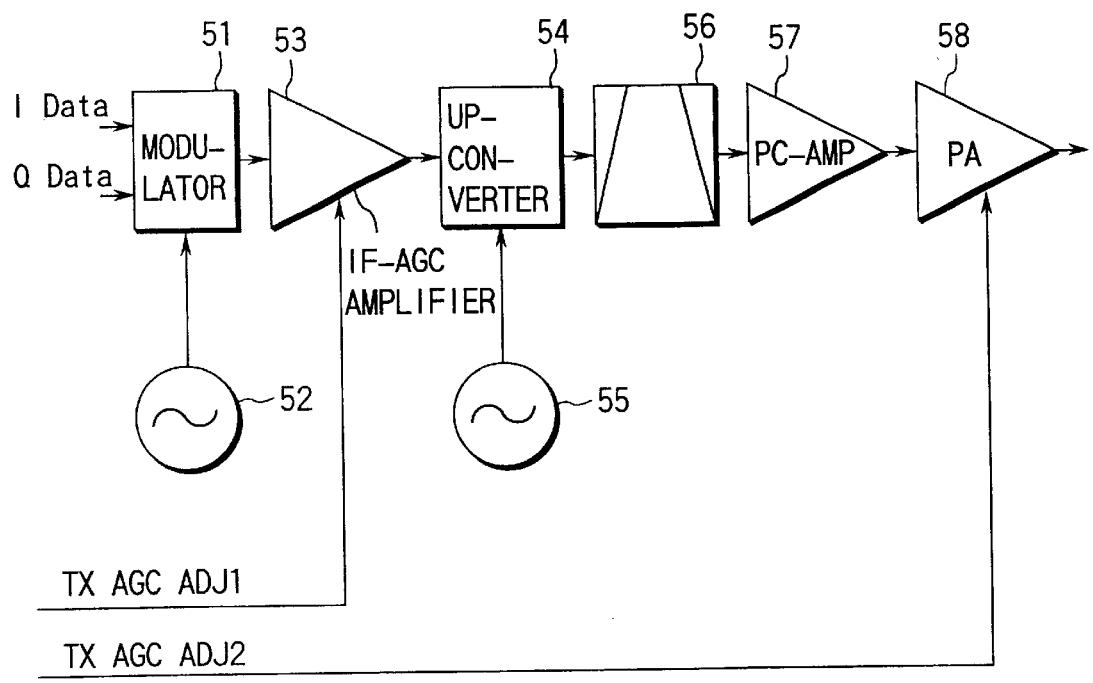
FIG. 1 is a block diagram showing the constitution of a conventional transmission system circuit of a CDMA mobile telephone system.

Thus, although the amounts of change in the control currents are the same, the up-converter circuit 31 is set (e.g. ICS1:ICS3:ICS5=4:2:1) so as to be driven in the region in which the drive current of the variable-current circuits changes most greatly, since the range within which the gain control signal TX Gain cont. increases (i.e. the gain changes) is on the high-gain side of the up-converter 30. Therefore, the affect of load fluctuation on the oscillating frequency of the TX-RF local oscillator 15 of FIG. 1 is greatest when the gain in the up-converter circuit 31 changes. To this end, the current curves I1 and I1' are set to become symmetrical to each other at the position of 50% current.

The operation of the circuit of FIG. 7 will be explained with reference to FIGS. 10A to 10D. FIGS. 10A to 10D are diagrams showing gain changes in the up-converter circuits 31, 32 and 33 with respect to the voltage level VGC of the gain control signal TX Gain cont. of the up-converter 30 (frequency converting circuit) shown in FIG. 7. FIGS. 10A to 10D further show a case where the gain characteristic of the up-converter 30 comprising a synthesis of those of the up-converter circuits 31 to 33 is controlled so as to increase monotonously.

Figure 10A:
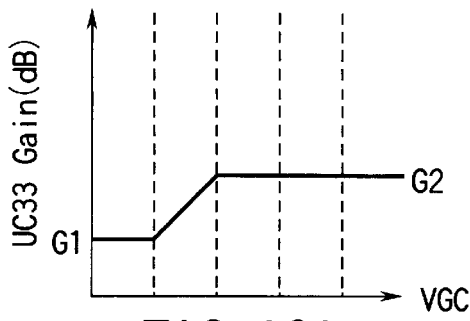
FIGS. 10A, 10B, 10C and 10D are characteristics diagrams showing examples of controlling gain in a gain controller of the transmission apparatus according to the third embodiment.
Figure 10B:
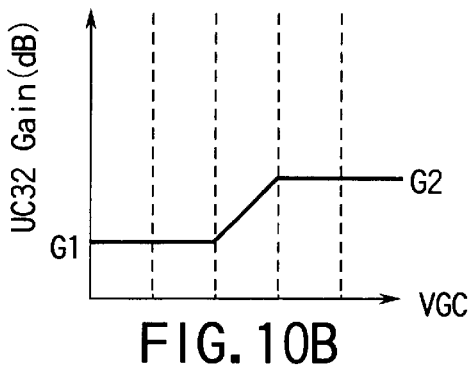
Figure 10C:
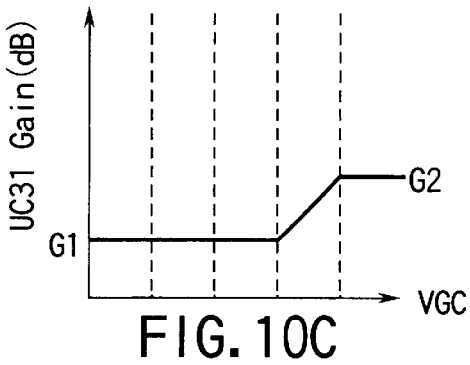
Figure 10D:
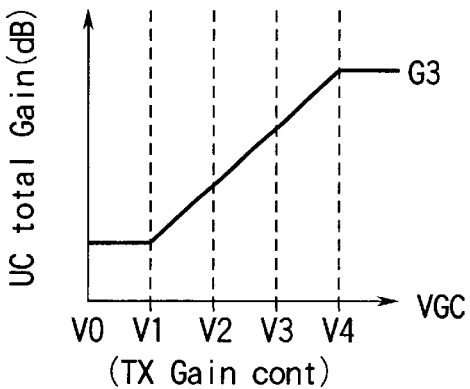

FIGS. 10A, 10B and 10C show changes in gain in the up-converter circuits 31, 32 and 33 of FIG. 7 with respect to the voltage level VGC of the gain control signal TX Gain cont., and FIG. 10D shows changes in the total gain of the up-converter 30 with respect to the gain control signal TX Gain cont.

In the embodiment shown in FIG. 7, the up-converter circuits 31, 32 and 33 are each configured so that their gain changes when a control signal is supplied from the variable-current circuit controllers 36 to 38. only the up-converter circuit 34 has constant gain, being supplied by the fixed current sources CS7 and CS8. Therefore, the total output of the four up-converter circuits 31 to 34 is delivered from the MIX-OUT terminal. As described above, the up-converter circuit 35 is a dummy to accommodate fluctuation in the load of the up-converter circuit 31. When IC characteristics can be satisfied with respect to load fluctuation, the dummy up-converter circuit 35 can be deleted. In the embodiment of FIG. 7, the control signal to the dummy up-converter circuit 35 is supplied from the variable-current circuit controller 36, but it may be supplied from either of the other variable-current circuit controller 37 or 38. In the embodiment of FIG. 7, the fluctuation of the drive current is most considerable in the up-converter circuit 31, making the up-converter circuit 31 most susceptible to the affects of frequency fluctuation. For this reason, the control signal of the dummy up-converter circuit 35 is extracted from the variable-current circuit controller 36.

The operation of the up-converter 30 configured as shown in FIG. 7 will be explained with reference to the characteristics diagrams of FIGS. 10A to 10D.

When the voltage level of the gain control signal TX Gain cont. input to the gain control circuit 40 changes from V0 to the threshold value V1, the gain control circuit 40 generates the gain adjustment signals GC-ADJ23, GC-ADJ22 and GC-ADJ21 so that the gains UC31-Gain, UC32-Gain and UC33-Gain of the up-converter circuits (UC) 31 to 33 each remain constant at G1 as shown in FIGS. 10C, 10B and 10A.

Moreover, when the voltage level of the gain control signal TX Gain cont. input to the gain control circuit 40 changes from the first threshold value V1 to a second threshold value V2, the gain control circuit 40 generates the gain adjustment signal GC-ADJ23 so that the gain UC33-Gain of the up-converter circuit 33 increases linearly (monotonously) from G1 to G2 as shown in FIG. 10A. Meanwhile, the gain control circuit 40 generates the gain adjustment signals GC-ADJ22 and GC-ADJ21 so that the gains UC31-Gain and UC32-Gain of the other up-converter circuits (UC) 31 and 32 each remain constant at gain G1 as shown in FIGS. 10C and 10B.

Moreover, when the voltage level of the gain control signal TX Gain cont. input to the gain control circuit 40 changes from the second threshold value V2 to a third threshold value V3, the gain control circuit 40 generates the gain adjustment signal GC-ADJ23 so that the gain UC32-Gain of the up-converter circuit 32 increases linearly (monotonously) from G1 to G2 as shown in FIG. 10B. Meanwhile, the gain control circuit 40 generates the gain adjustment signals GC-ADJ23 and GC-ADJ21 so that the gains UC31-Gain and UC33-Gain of the other up-converter circuits (UC) 31 and 33 remain constant at the gains G1 and G2 respectively as shown in FIGS. 10C and 10A.

Moreover, when the voltage level of the gain control signal TX Gain cont. input to the gain control circuit 40 changes from the third threshold value V3 to a fourth threshold value V4, the gain control circuit 40 generates the gain adjustment signal GC-ADJ21 so that the gain UC31-Gain of the up-converter circuit 31 increases linearly (monotonously) from G1 to G2 as shown in FIG. 10C. Meanwhile, the gain control circuit 40 generates the gain adjustment signals GC-ADJ22 and GC-ADJ23 so that the gains UC32-Gain and UC33-Gain of the other up-converter circuits (UC) 32 and 33 each remain constant at gain G2 as shown in FIGS. 10B and 10A.

That is, at the stage where the voltage level of the gain control signal TX Gain cont. input to the gain control circuit 40 has reached the fourth threshold value V4, the total gain UC total-Gain of the up-converter 30 comprises a synthesis of the gains of the four up-converter circuits 31 to 34. As shown in FIG. 10D, the total gain UC total-Gain increases linearly (monotonously) from G1 to G3 as the voltage level of the gain control signal TX Gain cont. rises from V0 to V4.

The manner in which the voltage of the gain control signal TX Gain cont. input to the gain control circuit 40 is increases from the first threshold V1 to reach the fourth threshold V4 corresponds, for example, to monotonously increasing the voltage level from the threshold V1 to V2 in the gain adjustment in the up-converter 14 of FIG. 2 as shown in FIG. 3B.

FIG. 10D shows the overall output combining the gains of all the up-converter circuits 31 to 35 in the embodiment shown in FIG. 7. As is clear from FIG. 10D, the gain characteristics in a straight line as the voltage level of the gain control signal TX Gain cont. increases from V1 to V4 are shown, and there is no discontinuity at the change-over points between gain controls despite the division of the gain adjustment range across the up-converter circuits 31 to 33. When the variable-gain range of the individual up-converter circuits are made narrow, large changes in the gain do not cause the fluctuation of fT, making it possible to obtain a transmission output having a good waveform quality over a wide variable-gain range.

By using the circuit constitution of the embodiment shown in FIG. 7, it is possible to prevent the degradation of characteristic caused by fT when a total variable-gain range of the up-converter is widened than the case of embodiment of FIG. 5 in which the total variable-gain range of the up-converter is widened. As a result, it is clear that the waveform quality is superior to that obtained when using a single gain-variable block such as the first up-converter circuit 21 in FIG. 5.

Therefore, when the gain control circuit of the transmission circuit is configured by combining an up-converter having the gain characteristics shown in FIG. 10D instead of the up-converter having the gain characteristics shown in FIG. 3B with an IF-AGC amplifier having the same predetermined thresholds as those of FIG. 3A and flat gain characteristics, a wide total gain control range can be extracted and the adverse effects of the fT on transmission characteristics can be prevented as described above.

However, when a circuit having flat gain characteristics between the threshold values V1 and V2 (or V4) such as that shown in FIG. 3A is combined with a circuit having gain characteristics such as those shown in FIG. 3B or FIG. 10D, the total gain characteristics of the two circuits will not be linear at the positions of the threshold values V1 and V2 (or V4). As a consequence, the manufactured circuit will lose its linearity due to variation in the characteristics of the elements comprising the circuit, and will not exhibit clear linearity such as that shown in FIG. 3C, for example. This may cause distortions in the gain characteristics curve at the positions of the threshold values V1 and V2 (or V4).

Figure 11A:
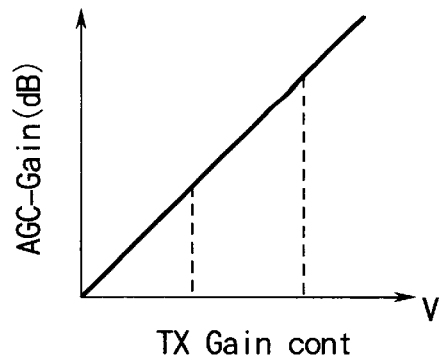
FIGS. 11A, 11B and 11C are characteristics diagrams showing examples of controlling gain in a gain controller of the transmission apparatus according to yet another embodiment of this invention.

To avoid such problems, an IF-AGC amplifier having the gain characteristics shown in FIG. 11A may be used.

A method of controlling gain in a case where the up-converter 14 has the gain characteristics shown in FIG. 3B or FIG. 10D by using an IF-AGC amplifier having the gain characteristics shown in FIG. 11A as the IF-AGC amplifier 13 in FIG. 2.

In this case, as shown in FIG. 11A, the rate of change in the gain of the IF-AGC amplifier 13 continuously increases monotonously in all change ranges of the gain control signal TX Gain cont., and there is no flat gain characteristic.

Figure 11B:
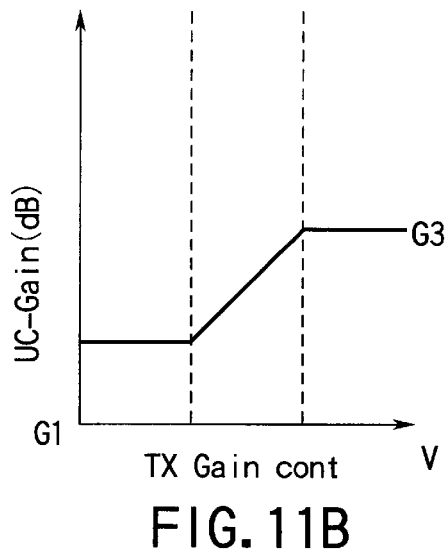

In contrast, as shown in FIG. 11B, the gain of the up-converter 14 is constant between the thresholds V0 and V1 and in the region exceeding V2, but increases monotonously between V1 and V2.

Figure 11C:
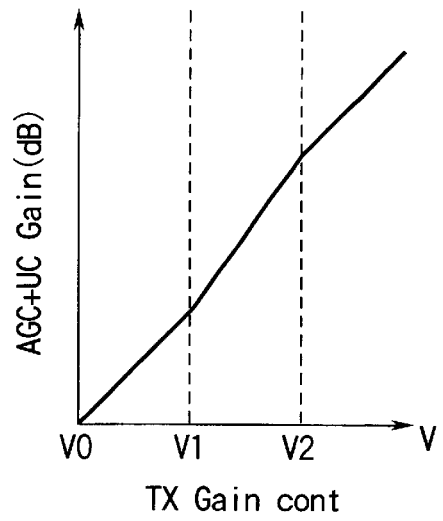

FIG. 11C shows the total gain characteristics obtained by synthesizing the above gain characteristics. After combining the two monotonously increasing characteristics, the gradient between the threshold values V1 and V2 becomes more acute.

As shown in FIG. 11C, when the IF-AGC amplifier 13 having the gain characteristics shown in FIG. 11A is synthesized with the up-converter 30 having the constitution of FIG. 7, the region where the voltage level is V0 to V1 and more than V4 becomes the gradient of the gain characteristics of the IF-AGC amplifier 13, and the region from V1 to V4 becomes a synthesis of the gain characteristics of the IF-AGC amplifier 13 and the gain characteristics of the up-converter 30, resulting in an acute gradient.

However, though not shown in the figure, when the mobile telephone system is configured such that the gain adjustment steps are narrower in this acute region than in the other regions, although this fact is not depicted in the diagram. This makes it possible to avoid irregularities such as disconnection during a call which are caused by frequency fluctuation resulting from wide gain adjustment.

As mentioned above, since the gain characteristic curve of FIG. 11A has no inflection point between the thresholds V1 and V2, the gain control does not lose its linearity even when there is variation in the characteristics of the elements comprising the circuit, thereby ensuring high-quality telephone communication.

The effect of the variable-gain operation of, for example, the variable-gain up-converter circuits 31 to 33 of the embodiment shown in FIG. 7 in the up-converter 14 on the oscillating frequency of the TX-RF local oscillator 15 of FIG. 2 will be explained.

For example, since the current of the up-converter circuit 31 is changed to vary a high gain region, when viewed from the TX-RF local oscillator 15 side, the currents of the transistors Q1 to Q4 appear to be changing. Consequently, the load capacitance of the TX-RF local oscillator 15 appears to be fluctuating, and when the frequency of the TX-RF local oscillator 15 rises as high as 1 GHz or the like, this capacitance fluctuation cannot be ignored. Therefore, the up-converter circuit 35 is provided as a dummy, and the sum of the drive currents ICS1 and ICS9 of the variable-current circuits CS1 and CS9 is kept constant. As a result, the total current to the transistors Q1 and Q2 and the transistors Q25 and Q26 is not changed, and fluctuation in load capacitance of the input to the up-converter circuit 31 can be reduced.

Since the gain is linearly changed throughout this entire mobile telephone system, the gain control voltage step in the segment from V1 to V2 can be controlled more narrowly than for example in the case described above where the gain was changed in segments (the segments V0 to V1 and above V2) only by the IF-AGC amplifier 13 of FIG. 11A.

For example, in the case where the total gain of the mobile telephone system is changed by a constant amount, as long as the ratio between the gradients of the gain control curves of the IF-AGC amplifier and the up-converter is 1:1, it will be sufficient for each amount of gain change to be halved in the segment V1 to V2 of FIG. 11C. By using this method to reduce the gradient of the gain of the up-converter, the amount of change in the gain of the up-converter can be relatively reduced.

This fact is relevant to reduce the amount of change in the current of the up-converter, as it may not be necessary to use the dummy circuit 35 used in the embodiment of FIG. 7 since the load capacitance fluctuation of the local oscillator input can now be reduced.

As described above, according to the embodiment of FIG. 7, by dividing the up-converter circuit into a plurality of blocks the variable gain range of each block is made narrow. Therefore, even when the total variable gain range of the up-converter is large, there is no problem that the amount of current is remarkably reduced consequently causing the fT to decrease, and the gain can be more precisely controlled.

Furthermore, the gain control circuit which controls the up-converter and the IF-AGC amplifier can be integrated as a single unit circuit. Therefore, the scale of the circuit can be kept small, making it possible to, for example, miniaturize the mobile telephone.

Furthermore, in a system constitution wherein the total gain characteristics of a communications terminal such as a mobile telephone or the like are made linear as shown in FIGS. 11A to 11C, the IF-AGC amplifier and the up-converter can carry the total gain while being separately controlled based on the same outside control signal. Therefore, the gain carried by the up-converter (UC) is 1/(IF AGC gain+UC gain) of the total system gain. The size of the carried gain can be reduced, thereby reducing the effect of load fluctuation in the up-converter when the gain is made variable, and maintaining a communications wave of high quality.

In the embodiments of FIG. 5 and FIG. 7, the transistors Q5 and Q6 constituting an amplification section in each of the up-converter circuits 21 and 31 are driven by the variable-current circuits CS1 and CS2 respectively. However, these transistors Q5 and Q6 may be commonly driven by a single variable-current circuit.

FIG. 12 shows one example of this modification, wherein the emitters of the transistors Q5 and Q6 are commonly connected directly to the single variable-current circuit CS1. The resistor R1 is omitted in FIG. 12 for the sake of simplicity. The other parts of the constitution, including the frequency converting circuit which comprises the transistors Q1 to Q4, are identical to the up-converters 21 and 31 in the embodiments of FIG. 5 and FIG. 7. The same reference characters are appended thereto and further explanation is omitted.

Furthermore, in addition to the up-converter circuit 23 in the embodiment of FIG. 5 and the up-converter circuit 31 in the embodiment of FIG. 7, the pairs of variable-current circuits in the other variable-gain up-converter circuits 32, 33 and 35 can be unified in exactly the same way. Moreover, the constant current sources of the fixed-gain up-converter circuits 22 and 34 can be similarly unified.

The frequency converting circuit of this invention is not limited to an up-converter, and can of course obtain similar effects when lowering frequencies.

As described above, according to this invention it is possible to provide a transmission circuit and a radio transmission apparatus which can be inexpensively manufactured without increasing their external sizes, and which can obtain a transmission output having a good waveform quality with low noise even over a wide variable gain range.

Furthermore, it is possible to obtain a frequency converter having a wide variable gain amplitude and a reduced NF even at the minimum gain, while using transistors which have a low transition frequency fT and can be manufactured by an inexpensive process.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A transmission circuit comprising:
    a modulating circuit which receives a data signal being transmitted and modulates an intermediate frequency signal in accordance with said data signal;
    an intermediate frequency amplifying circuit which receives and modulates an output from said modulating circuit, a gain of the intermediate frequency amplifying circuit being controlled in accordance with a first control signal; and
    an up-converter which has a gain controllable function in accordance with a second control signal and receives an output from said intermediate frequency amplifying circuit and increases a frequency of the output to a transmission frequency, the up-converter comprising at least one first converting circuit, a gain of the first converting circuit being controlled in accordance with said second control signal, and a second converting circuit connected in parallel with the first converting circuit and having substantially constant gain,
    wherein the intermediate frequency amplifying circuit and the up-converter are integrated in an integrated circuit.

2. The transmission circuit according to claim 1, wherein said up-converter is configured so as to have gain characteristics having a region in which the gain changes monotonously in accordance with said second control signal.

3. The transmission circuit according to claim 1, wherein said up-converter is configured so as to have gain characteristics having a region in which the gain changes in steps in accordance with said second control signal, and having hysteresis with respect to said second control signal.

4. The transmission circuit according to claim 1, wherein
    said at least one first converting circuit comprises at least two first converting circuits;
    an output terminal of one of the first converting circuits is connected to an output terminal of said second converting circuit and the gain of said one first converting circuit is controlled in accordance with said second control signal;
    an output terminal of another of the first converting circuits is not connected to the output terminal of said second converting circuit, a drive current of said another first converting circuit being controlled in complement with said one first converting circuit in accordance with said second control signal.

5. The transmission circuit according to claim 1, wherein said up-converter comprises a plurality of first converting circuits connected in parallel with each other, gains of the plurality of first converting circuits being controlled in accordance with said second control signal.

6. The transmission circuit according to claim 5, wherein said plurality of first converting circuits comprise two or more first converting circuits having output terminals which are commonly connected, the gains of the first converting circuits being controlled in accordance with said second control signal;
    said up-converter further comprises a dummy circuit whose output terminal is not connected to the common output terminals of said two or more first converting circuits, a drive current of the dummy circuit being controlled in complement with one of said first converting circuits of said two or more first converting circuits in accordance with said second control signal.

7. The transmission circuit according to claim 6, wherein the one of said first converting circuits of which the drive current is controlled in complement has the drive current which changes most greatly among said two or more first converting circuits.

8. The transmission circuit according to claim 1, further comprising a control signal generating circuit configured as a single circuit unit which receives a control signal from outside and generates said first and second control signals.

9. A transmission circuit comprising:
    an intermediate frequency signal generating circuit which generates an intermediate frequency signal;
    a modulating circuit which receives a data signal being transmitted and said intermediate frequency signal, and modulates said intermediate frequency signal in accordance with said data signal;
    an intermediate frequency amplifying circuit which receives and modulates an output from said modulating circuit, a gain of the intermediate frequency amplifying circuit being controlled in accordance with a first control signal;
    a local oscillator signal generating circuit which generates a local oscillator signal;
    an up-converter which has a gain controllable function in accordance with a second control signal and receives an output from said intermediate frequency amplifying circuit and said local oscillator signal and increases a frequency of the output of said intermediate frequency amplifying circuit to a transmission frequency, the up-converter comprising at least one first converting circuit, a gain of the first converting circuit being controlled in accordance with said second control signal, and a second converting circuit connected in parallel with the first converting circuit and having substantially constant gain;
    a filter circuit which receives an output of said up-converter; and
    a power amplifying circuit which amplifies an output of said filter circuit and has substantially constant gain,
    wherein the intermediate frequency amplifying circuit and the up-converter are integrated in an integrated circuit.

10. The radio transmission apparatus according to claim 9, wherein said at least one first converting circuit comprises at least two first converting circuits;

an output terminal of one of said first converting circuits is connected to an output terminal of said second converting circuit and the gain of said one first converting circuit is controlled in accordance with said second control signal;

an output terminal of another of the first converting circuits is not connected to the output terminal of said second converting circuit, a drive current of said another first converting circuit being controlled in complement with said one first converting circuit in accordance with said second control signal.

11. The radio transmission apparatus according to claim 9, wherein said up-converter comprises a plurality of first converting circuits connected in parallel with each other, gains of the plurality of first converting circuits being controlled in accordance with said second control signal.

12. The radio transmission apparatus according to claim 11, wherein said plurality of first converting circuits comprise two or more first converting circuits having output terminals which are commonly connected, the gains of the first converting circuits being controlled in accordance with said second control signal;

said up-converter further comprising a dummy circuit whose output terminal is not connected to the common output terminals of said two or more first converting circuits, a drive current of the dummy circuit being controlled in complement with one of said first converting circuits of said two or more first converting circuits in accordance with said second control signal.

13. The radio transmission apparatus according to claim 12, wherein the one of said first converting circuits of which the drive current is controlled in complement has the drive current which changes most greatly among said two or more first converting circuits.

14. The radio transmission apparatus according to claim 9, wherein a control signal generating circuit configured as a single circuit unit which receives a control signal from outside and generates said first and second control signals is further integrated in said integrated circuit.

15. A transmission circuit comprising:

an intermediate frequency signal generating circuit which generates an intermediate frequency signal;

a modulating circuit which receives a data signal being transmitted and said intermediate frequency signal, and modulates said intermediate frequency signal in accordance with said data signal;

an intermediate frequency amplifying circuit which receives and modulates an output from said modulating circuit, a gain of the intermediate frequency amplifying circuit being controlled in accordance with a first control signal;

a local oscillator signal generating circuit which generates a local oscillator signal;

an up-converter which has a gain controllable function in accordance with a second control signal and receives an output from said intermediate frequency amplifying circuit and said local oscillator signal and increases a frequency of the output of said intermediate frequency amplifying circuit to a transmission frequency;

a filter circuit which receives an output of said up-converter; and a power amplifying circuit which amplifies an output of said filter circuit and has substantially constant gain, wherein the intermediate frequency amplifying circuit and the up-converter are integrated in an integrated circuit, and wherein said up-converter is configured so as to have gain characteristics having a region in which the gain changes monotonously in accordance with said second control signal.

16. The radio transmission apparatus according to claim 5, wherein said intermediate frequency amplifying circuit and up-converter have gain characteristics such that their gains continuously change monotonously within their respective variable gain ranges in accordance with said first and second control signals, and a monotonous gradient in the variable gain range of said up-converter becomes acute when the gains are synthesized.

17. A transmission circuit comprising:

an intermediate frequency signal generating circuit which generates an intermediate frequency signal;

a modulating circuit which receives a data signal being transmitted and said intermediate frequency signal, and modulates said intermediate frequency signal in accordance with said data signal;

an intermediate frequency amplifying circuit which receives and modulates an output from said modulating circuit, a gain of the intermediate frequency amplifying circuit being controlled in accordance with a first control signal;

a local oscillator signal generating circuit which generates a local oscillator signal;

an up-converter which has a gain controllable function in accordance with a second control signal and receives an output from said intermediate frequency amplifying circuit and said local oscillator signal and increases a frequency of the output of said intermediate frequency amplifying circuit to a transmission frequency;

a filter circuit which receives an output of said up-converter; and a power amplifying circuit which amplifies an output of said filter circuit and has substantially constant gain, wherein the intermediate frequency amplifying circuit and the up-converter are integrated in an integrated circuit, and wherein said up-converter is configured so as to have gain characteristics having a region in which the gain changes in steps in accordance with said second control signal, and having hysteresis with respect to said second control signal.

18. A frequency converting circuit for converting a frequency of a first input signal by using a second input signal, the frequency converting circuit comprising:

a first frequency converting section comprising first and second transistors and third and fourth transistors, control terminals thereof being connected respectively to first and second input terminals to which said second input signal is supplied;

a variable-gain first amplifying circuit comprising a fifth transistor which is commonly connected to one terminal of said first and third transistors, a sixth transistor which is commonly connected to one terminal of said second and fourth transistors, and a first variable-current circuit which is connected to said fifth and sixth transistors, said first input signal being supplied to control terminals of said fifth and sixth transistors;

a first variable-current circuit controller which supplies a current control signal to said first variable-current circuit;

a second frequency converting section comprising seventh and eighth transistors and ninth and tenth transistors, control terminals thereof being connected respectively to first and second input terminals to which said second input signal is supplied;

a second amplifying circuit having a substantially constant gain comprising an eleventh transistor which is commonly connected to one terminal of said seventh and ninth transistors, a twelfth transistor which is commonly connected to one terminal of said eighth and tenth transistors, and a current source which is connected to said eleventh and twelfth transistors, said first input signal being supplied to control terminals of said eleventh and twelfth transistors; and an output being extracted from an output section comprising a common connection of other terminals of said second, third, eighth and ninth transistors.

19. The frequency converting circuit according to claim 18, at least further comprising:

a third frequency converting section comprising thirteenth and fourteenth transistors and fifteenth and sixteenth transistors, control terminals thereof being respectively connected to first and second input terminals to which said second input signal is supplied;

a variable-gain third amplifying circuit comprising a seventeenth transistor commonly connected to one terminal of the thirteenth and fifteenth transistors, an eighteenth transistor commonly connected to one terminal of the fourteenth and sixteenth transistors, and a second variable-current circuit connected to said seventeenth and eighteenth transistors, said first input signal being supplied to control terminals of said seventeenth and eighteenth transistors;

a second variable-current circuit controller which supplies a current control signal to said second variable-current circuit; and an output being extracted from an output section comprising a common connection of other terminals of said second, third, eighth, ninth, fourteenth and fifteenth transistors.

20. The frequency converting circuit according to claim 18, further comprising:

a fourth frequency converting section comprising nineteenth and twentieth transistors and twenty-first and twenty-second transistors, control terminals thereof being respectively connected to the first and second input terminals to which said second input signal is supplied;

a variable-gain fourth amplifying circuit comprising a twenty-third transistor commonly connected to one terminal of the nineteenth and twenty-first transistors, a twenty-fourth transistor commonly connected to one terminal of the twentieth and twenty-second transistors, and a third variable-current circuit connected to said twenty-third and twenty-fourth transistors, said first input signal being supplied to control terminals of said twenty-third and twenty-fourth transistors; and a common connection of the other terminals of said twentieth and twenty-first transistors being not connected to the output section, but instead a drive current of said third variable-current circuit being controlled by said first variable-current circuit controller in complement with said first variable-current circuit.

\* \* \* \* \*